(12) United States Patent
Lee et al.

(10) Patent No.: US 11,599,162 B2
(45) Date of Patent: *Mar. 7, 2023

(54) DISPLAY DEVICE

(71) Applicant: Samsung Display Co., Ltd., Yongin-si (KR)

(72) Inventors: Chung-Seok Lee, Hwaseong-si (KR); Hayoung Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/374,915

(22) Filed: Jul. 13, 2021

(65) Prior Publication Data

US 2021/0341974 A1    Nov. 4, 2021

Related U.S. Application Data

(63) Continuation of application No. 16/856,032, filed on Apr. 23, 2020, now Pat. No. 11,093,011.

(30) Foreign Application Priority Data

Sep. 4, 2019 (KR) .................... 10-2019-0109356

(51) Int. Cl.
*G06F 1/18* (2006.01)
*G09F 9/30* (2006.01)
(Continued)

(52) U.S. Cl.
CPC .......... *G06F 1/189* (2013.01); *G06F 1/1652* (2013.01); *G09F 9/301* (2013.01); *H01L 27/3276* (2013.01)

(58) Field of Classification Search
None
See application file for complete search history.

(56) References Cited

U.S. PATENT DOCUMENTS 5,729,315 A * 3/1998 Takahashi ............. G02F 1/1345
                                                    349/149
5,844,314 A * 12/1998 Kim ........................ H01L 24/31
                                                    257/737

(Continued)

FOREIGN PATENT DOCUMENTS

CN      101692329 B  *  7/2012
JP      2012-141468      7/2012
(Continued)

OTHER PUBLICATIONS

Non-Final Office Action dated Dec. 4, 2020, in U.S. Appl. No. 16/856,032.

(Continued)

*Primary Examiner* — Ryan Crockett
(74) *Attorney, Agent, or Firm* — H.C. Park & Associates, PLC

(57) ABSTRACT

A display device including a lower substrate having a display area and a pad area, a display structure disposed in the display area of the lower substrate, pad electrodes disposed in the pad area of the lower substrate and spaced apart in a first direction, and a conductive film package including a base substrate disposed on the pad electrodes, and including a corner portion having a curved shape, bump electrodes disposed in a first portion of a bottom surface of the base substrate and overlapping the pad electrodes, metal patterns disposed in second portions of the bottom surface of the base substrate positioned at both sides of the first portion, a first film layer disposed between the base substrate and the lower substrate and overlapping the pad electrodes, a part of the bump electrodes, and the metal patterns, and conductive balls disposed inside the first film layer.

1 Claim, 17 Drawing Sheets

(51) Int. Cl.
*G06F 1/16* (2006.01)
*H01L 27/32* (2006.01)

(56) References Cited

U.S. PATENT DOCUMENTS

| | | | |
|---|---|---|---|
| 7,459,789 B2 | 12/2008 | Kim et al. | |
| 7,965,366 B2 | 6/2011 | Shie | |
| 10,177,129 B2 | 1/2019 | Namkung et al. | |
| 2005/0233613 A1* | 10/2005 | Naitoh | H05K 3/361 |
| | | | 439/67 |
| 2005/0241758 A1* | 11/2005 | Kim | H05K 3/361 |
| | | | 156/308.2 |
| 2007/0018335 A1* | 1/2007 | Cho | H01L 23/562 |
| | | | 257/E23.021 |
| 2013/0021571 A1* | 1/2013 | Lee | H05K 3/3452 |
| | | | 349/150 |
| 2013/0120704 A1* | 5/2013 | Chen | G02F 1/1345 |
| | | | 349/150 |
| 2016/0043153 A1 | 2/2016 | Min | |
| 2017/0135216 A1* | 5/2017 | Cho | H05K 1/118 |
| 2017/0256583 A1 | 9/2017 | Choi et al. | |
| 2017/0271299 A1 | 9/2017 | Li et al. | |
| 2018/0006004 A1* | 1/2018 | Namkung | H01L 27/3276 |
| 2019/0035760 A1 | 1/2019 | Li et al. | |
| 2020/0051940 A1* | 2/2020 | Kim | H01L 24/14 |

FOREIGN PATENT DOCUMENTS

| | | |
|---|---|---|
| KR | 10-2006-0002209 | 1/2006 |
| KR | 10-2011-0077550 | 7/2011 |
| KR | 10-2018-0003716 | 1/2018 |

OTHER PUBLICATIONS

Notice of Allowance dated Apr. 12, 2021, in U.S. Appl. No. 16/856,032.

* cited by examiner

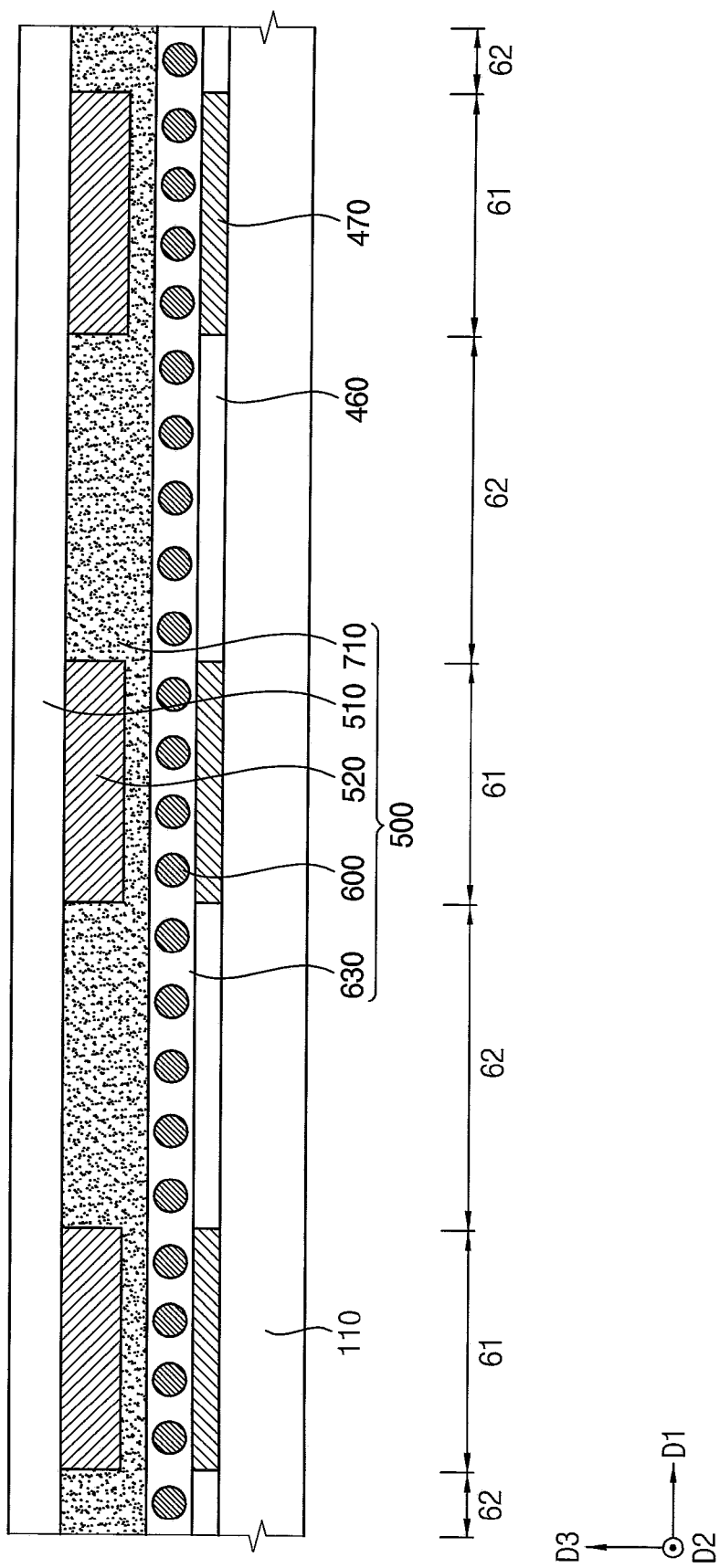

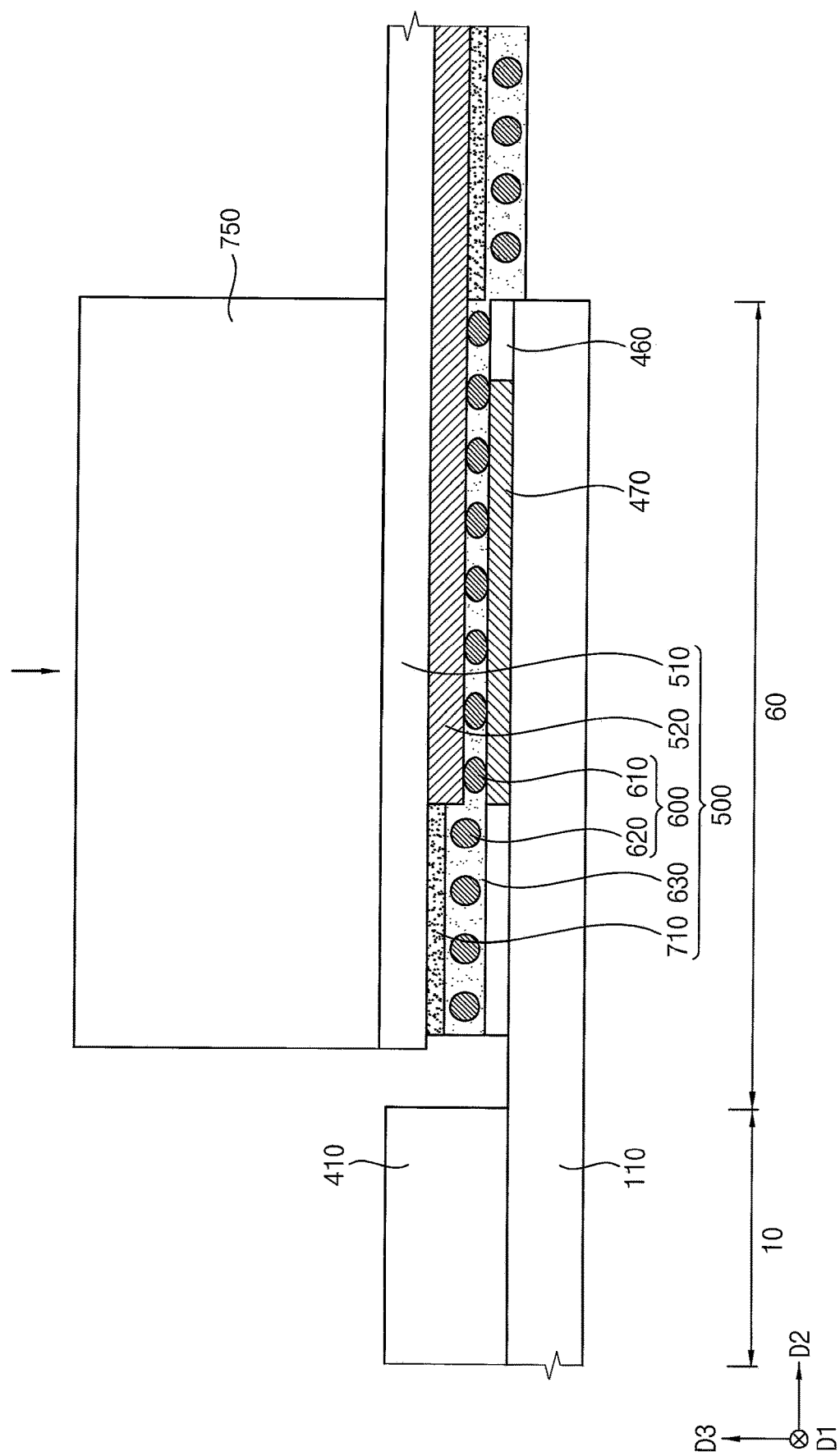

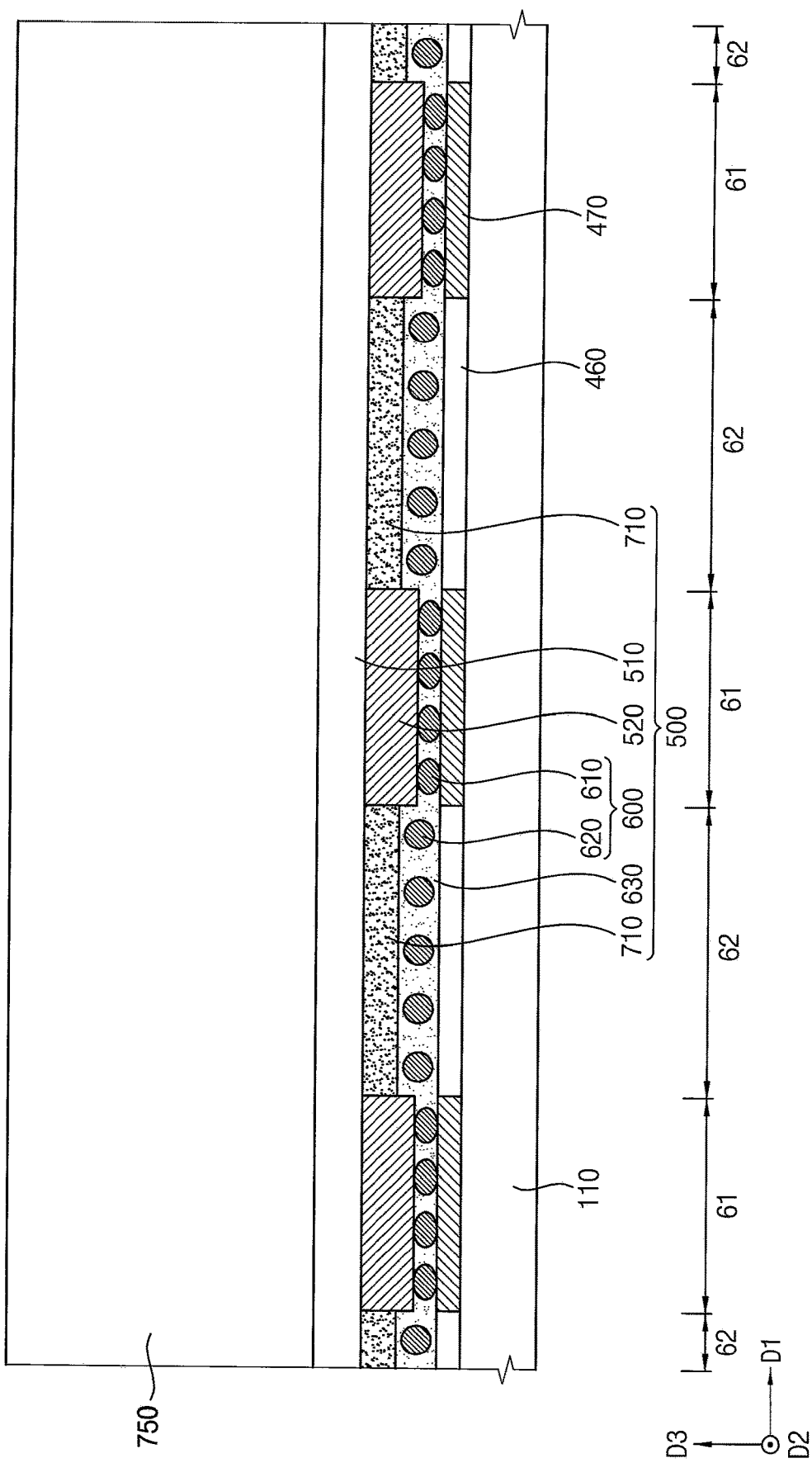

DISPLAY DEVICE

CROSS-REFERENCE TO RELATED APPLICATION

This application is a Continuation of U.S. patent application Ser. No. 16/856,032, filed on Apr. 23, 2020, which claims priority to and the benefit of Korean Patent Application No. 10-2019-0109356, filed Sep. 4, 2019, each of which are hereby incorporated by reference for all purposes as if fully set forth herein.

BACKGROUND

Field

Exemplary embodiments relate generally to a display device and, more specifically, to a display device including a conductive film package.

Discussion of the Background

A flat panel display device is used as a display device to replace a cathode ray tube display device due to its light weight and slim structure. The flat panel display device includes a liquid crystal display device and an organic light emitting display device, for example.

The display device may include a lower substrate, an upper substrate, and a plurality of pad electrodes. The pad electrodes may be electrically connected to an external device, and may be arranged in a pad area of the lower substrate in a first direction while being spaced apart from each other. A length of the pad area in a second direction perpendicular to the first direction may typically be reduced in order to reduce a dead space of the display device. In this case, a length of each of the pad electrodes in the second direction may also be reduced. An anisotropic conductive film and a flexible printed circuit board (for example, a chip on film) may be disposed on the pad electrodes in order to be electrically connected to the external device. The anisotropic conductive film may bond the pad electrode to the flexible printed circuit board, and the pad electrode may be electrically connected to the flexible printed circuit board through the conductive balls included in the anisotropic conductive film. However, it is generally difficult to manufacture the anisotropic conductive film having a length of 0.6 mm or less in the second direction. In other words, the reduced length of the pad area (for example, 0.5 mm or less) causes difficulty in forming the anisotropic conductive film on the pad electrode.

The above information disclosed in this Background section is only for understanding of the background of the inventive concepts, and, therefore, it may contain information that does not constitute prior art.

SUMMARY

Display devices constructed according to exemplary embodiments of the invention include a conductive film package.

Additional features of the inventive concepts will be set forth in the description which follows, and in part will be apparent from the description, or may be learned by practice of the inventive concepts.

A display device according to an exemplary embodiment includes a lower substrate having a display area and a pad area, a display structure disposed in the display area of the lower substrate, pad electrodes disposed in the pad area of the lower substrate and spaced apart from each other in a first direction, and a conductive film package including a base substrate disposed on the pad electrodes, and including a corner portion having a curved shape, bump electrodes disposed in a first portion of a bottom surface of the base substrate and overlapping the pad electrodes, metal patterns disposed in second portions of the bottom surface of the base substrate positioned at both sides of the first portion, a first film layer disposed between the base substrate and the lower substrate and overlapping the pad electrodes, a part of the bump electrodes, and the metal patterns, and conductive balls disposed inside the first film layer.

The corner portion of the base substrate may be disposed in the pad area of the lower substrate.

The metal patterns may include an alignment pattern disposed adjacent to the corner portion of the base substrate, and an adhesive pattern disposed in parallel with the bump electrodes.

At least one of corners of the first film layer may be aligned with a corner of the alignment pattern.

The first film layer may cover the adhesive pattern.

The conductive balls may be arranged in the first direction and a second direction perpendicular to the first direction, and may be spaced apart from each other at same intervals.

The base substrate may include a first area in which the pad electrodes are disposed and a second area disposed between adjacent first areas.

The conductive balls may include first conductive balls disposed in the first area, each having a first diameter in a direction from the lower substrate to the base substrate, and second conductive balls disposed in the second area, each having a second diameter in the direction from the lower substrate to the base substrate greater than the first diameter.

At least a part of each of the first conductive balls may contact the pad electrodes and the bump electrodes.

The first film layer may partially cover the conductive balls.

The first film layer disposed in the first area may have a thickness different from that disposed in the second area.

The first film layer disposed in the first area may have a first thickness and expose at least a part of each of the conductive balls disposed in the first area, and the first film layer disposed in the second area may have a second thickness greater than the first thickness and cover the conductive balls in the second area.

The conductive film package may further include a second film layer disposed between the first film layer and the base substrate.

The conductive ball may not be disposed inside the second film layer.

The second film layer may be disposed in the second area, a top surface of the second film layer contacts the bottom surface of the base substrate, and a bottom surface of the second film layer contacts a top surface of the first film layer.

A first end of each of the bump electrodes may overlap the first film layer, each of the bump electrodes may extend in a second direction perpendicular to the first direction, and a second end of each of the bump electrodes may not overlap the first film layer.

The bump electrodes and the pad electrodes may be electrically connected to each other through the conductive balls.

The display device may further include an upper substrate disposed on the display structure in the display area, and opposing the lower substrate, in which the pad area of the lower substrate may not overlap the upper substrate.

A length of the pad area in a second direction perpendicular to the first direction may be less than about 600 micrometers, and a length of each of the pad electrodes in the second direction may be less than about 300 micrometers.

A curvature of the corner portion may be less than about 0.3 R.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 10, FIG. 11, FIG. 12, FIG. 13, FIG. 14, FIG. 15, FIG. 16, FIG. 17, FIG. 18, and FIG. 19 are views showing a method of manufacturing the display device according to an exemplary embodiment.

DETAILED DESCRIPTION

Figure 1:
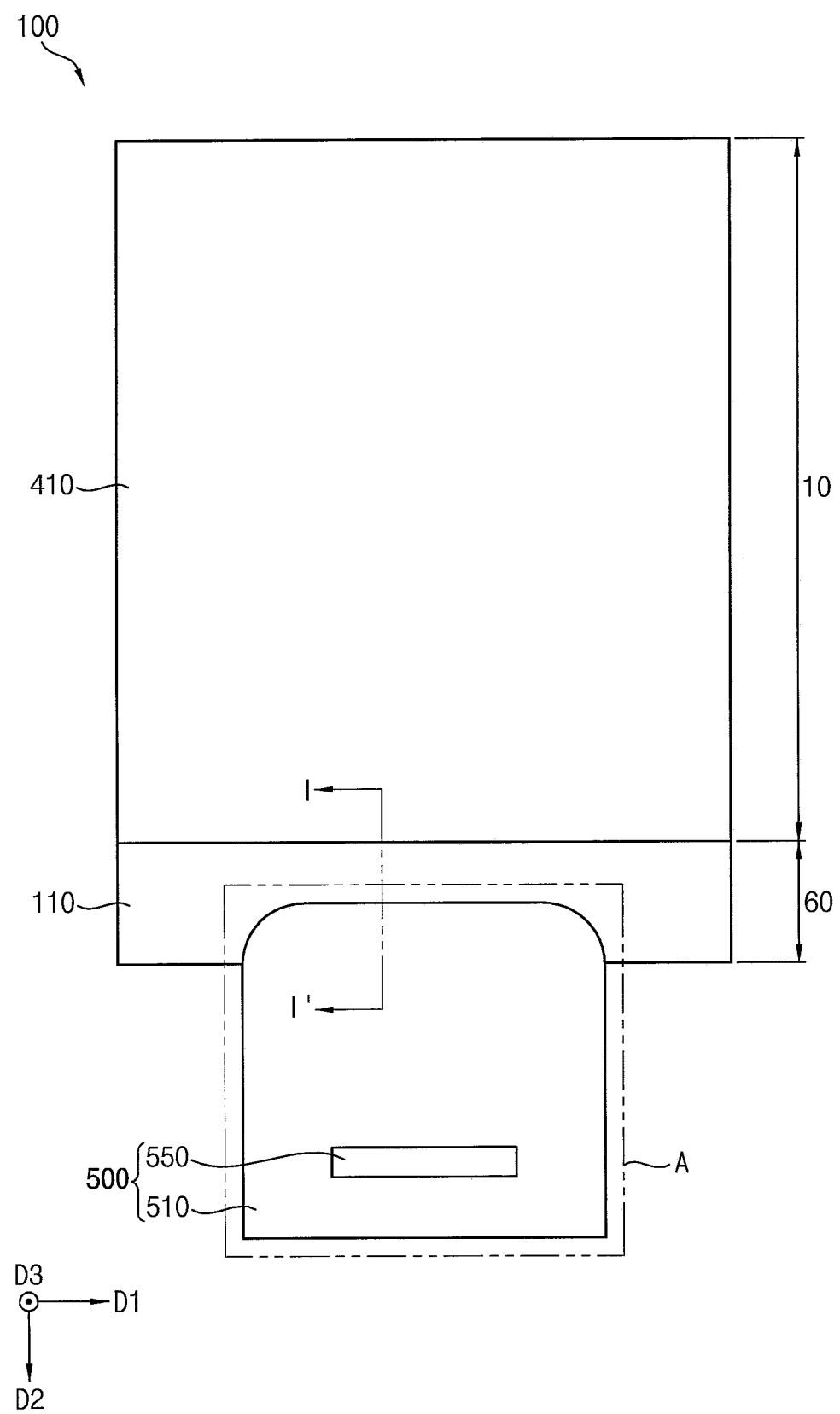
FIG. 1 is a plan view showing a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
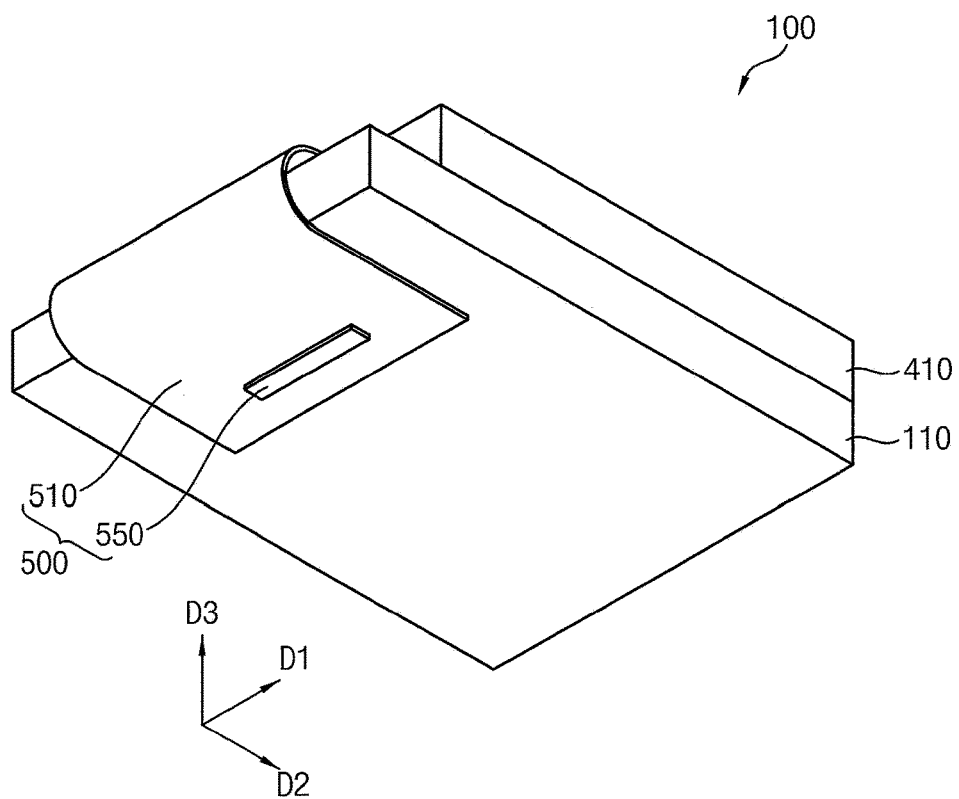
FIG. 2 is a perspective view showing the display device of FIG. 1.
Figure 3:
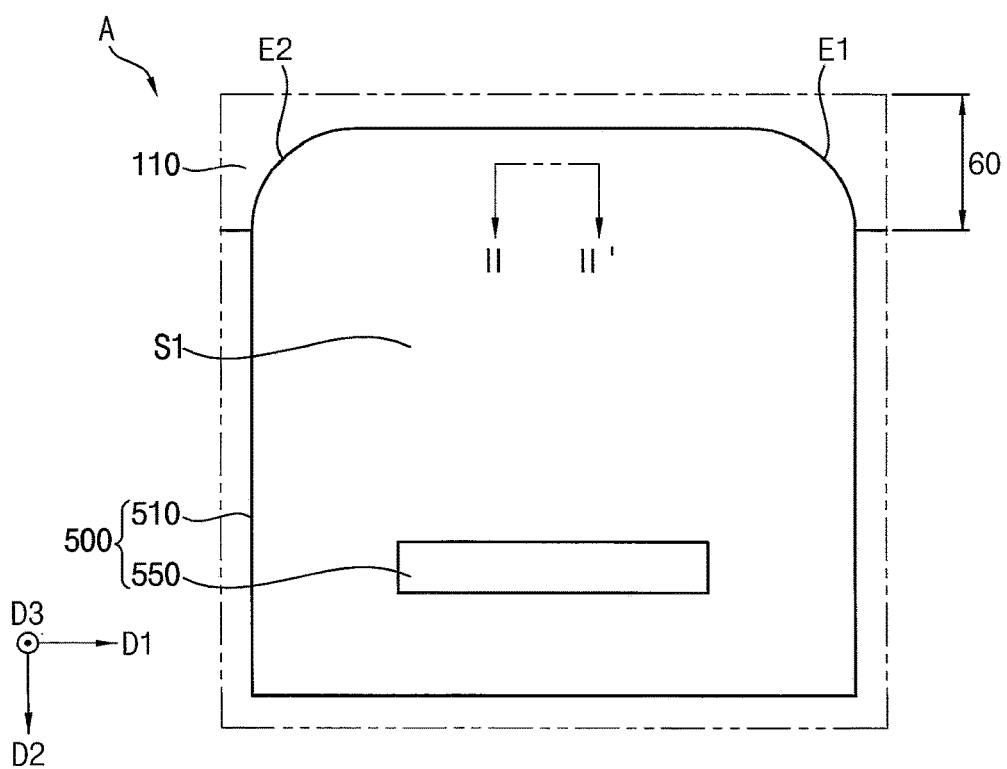
FIG. 3 is a partially enlarged plan view showing area 'A' of FIG. 1.
Figure 4:
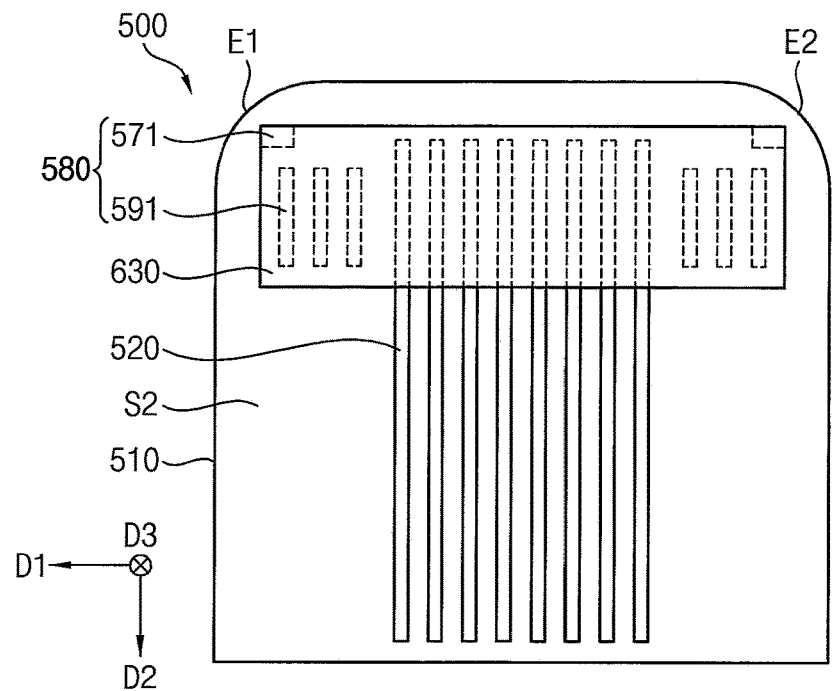
FIG. 4 is a plan view showing a rear side of a conductive film package included in the display device of FIG. 1.
Figure 5:
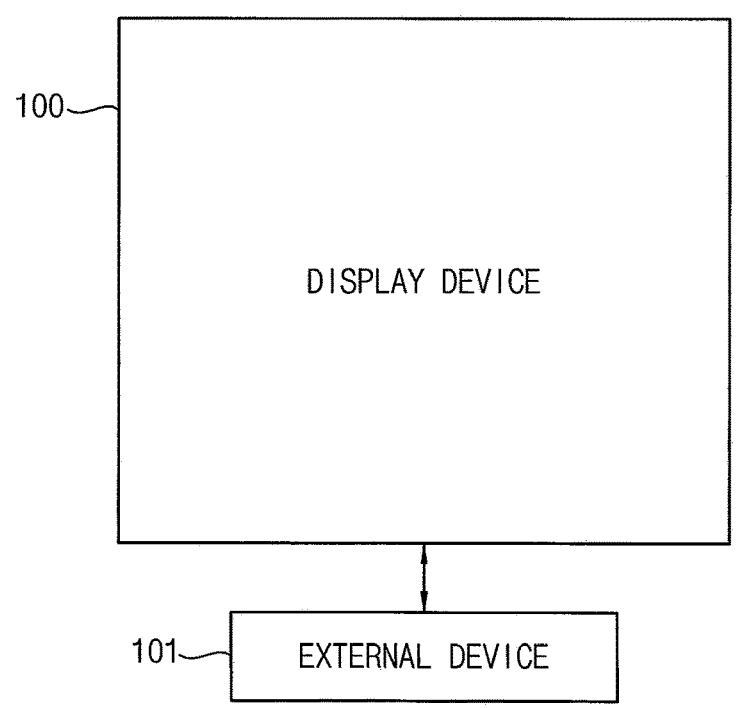
FIG. 5 is a block diagram illustrating an external device electrically connected to the display device.
Figure 6:
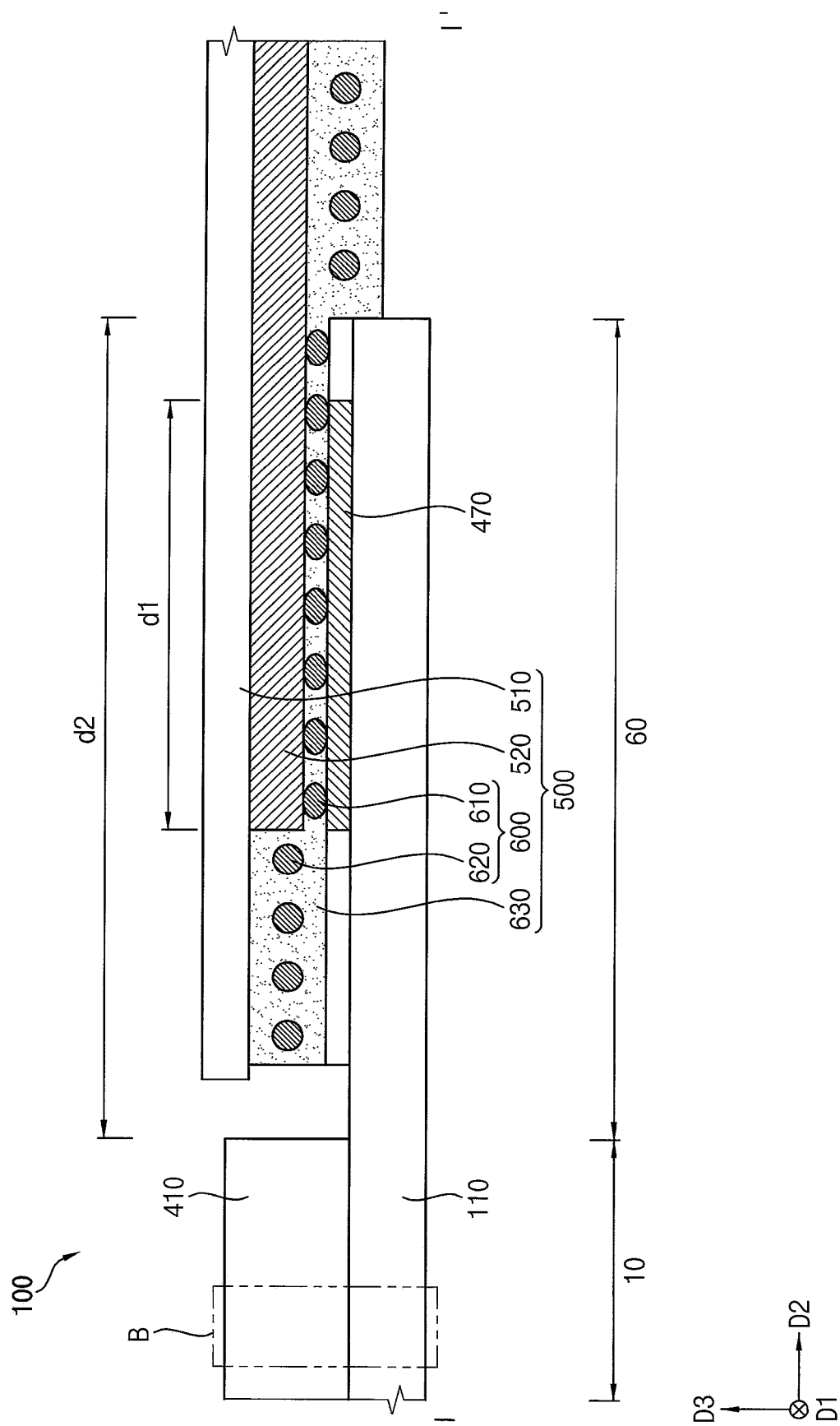
FIG. 6 is a cross-sectional view taken along line I-I' of FIG. 1.
Figure 7:
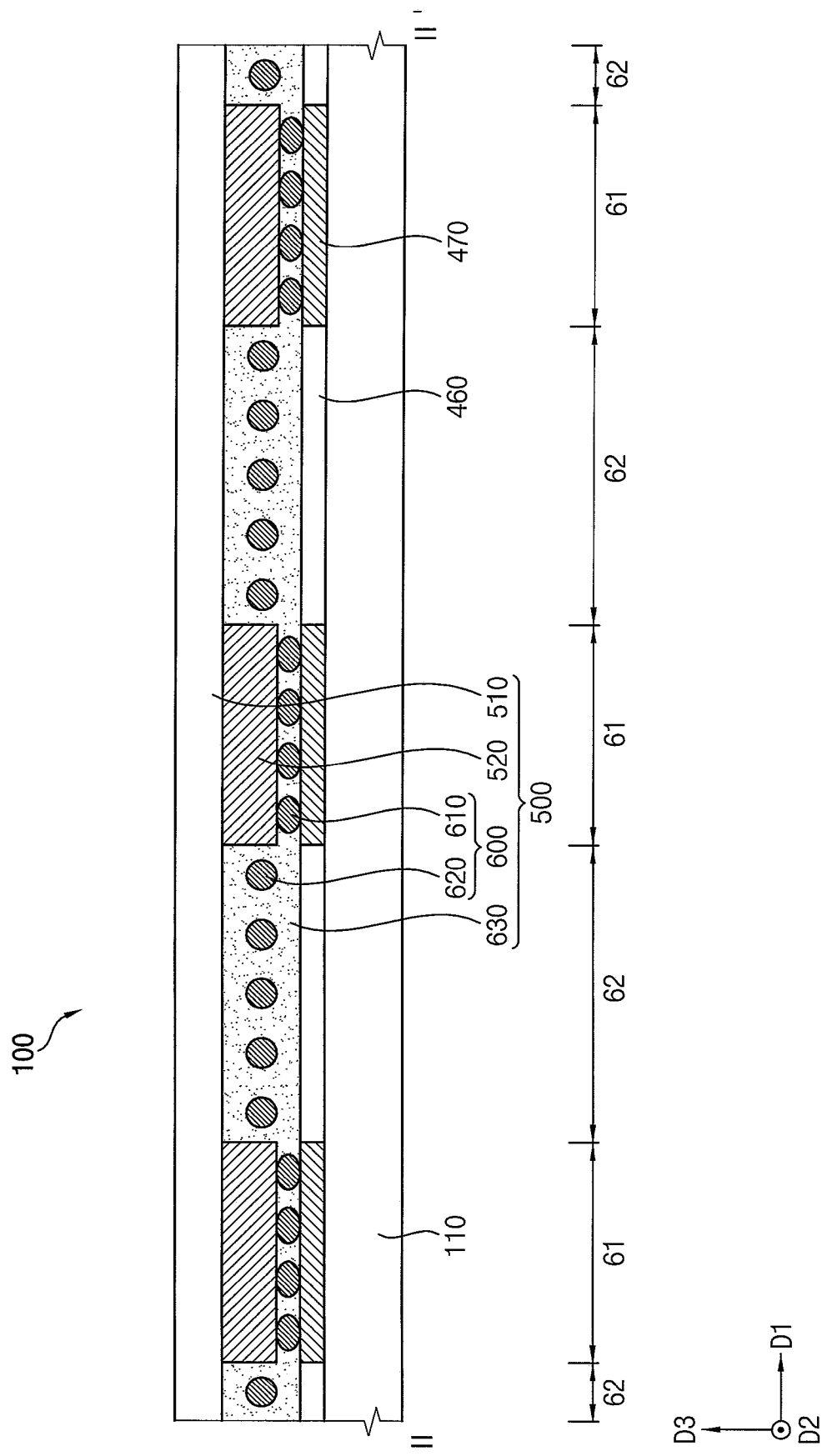
FIG. 7 is a cross-sectional view taken along line II-II' of FIG. 3.

FIG. 1 is a plan view showing a display device according to an exemplary embodiment. FIG. 2 is a perspective view showing the display device of FIG. 1. FIG. 3 is a partially enlarged plan view of area 'A' of FIG. 1. FIG. 4 is a plan view showing a rear side of a conductive film package included in the display device of FIG. 1. FIG. 5 is a block diagram illustrating an external device electrically connected to the display device. FIG. 6 is a cross-sectional view taken along line I-I' of FIG. 1. FIG. 7 is a cross-sectional view taken along line of FIG. 3. For example, FIG. 2 is a perspective view exemplarily showing a conductive film package 500 when bent.

Referring to FIGS. 1, 3, 4, 6, and 7, the display device 100 may include a lower substrate 110, a display structure 200 (see FIGS. 6 and 8), an upper substrate 410, an insulating layer 460, pad electrodes 470, a conductive film package 500, and the like. The lower substrate 110 may include a display area 10 and a pad area 60 positioned at one side of the display area 10. The conductive film package 500 may include a base substrate 510, bump electrodes 520, metal patterns 580, a driving integrated circuit 550, conductive balls 600, and a film layer 630. In addition, the metal patterns 580 may include an alignment pattern 571 and an adhesive pattern 591, and the conductive balls 600 may include first conductive balls 610 and second conductive balls 620.

The lower substrate 110 may include a transparent or opaque material. The lower substrate 110 may include a quartz substrate, a synthetic quartz substrate, a calcium fluoride substrate, a fluorine-doped (F-doped) quartz substrate, a sodalime glass substrate, a non-alkali glass substrate, and the like. In other exemplary embodiments, the lower substrate 110 may be formed of a transparent resin substrate having flexibility, such as a polyimide substrate. In this case, the polyimide substrate may include a first polyimide layer, a barrier film layer, a second polyimide layer, and the like.

The display structure 200 (for example, the display structure 200 of FIG. 8) may be disposed in the display area 10 on the lower substrate 110. An image, such as a video image, may be displayed in the display area 10 through the display structure 200.

The upper substrate 410 may be disposed in the display area 10 on the display structure 200. The upper substrate 410 may face the lower substrate 110, and may not be disposed in the pad area 60. The upper substrate 410 may include substantially the same material as the lower substrate 110. For example, the upper substrate 410 may include a quartz substrate, a synthetic quartz substrate, a calcium fluoride substrate, a fluorine-doped (F-doped) quartz substrate, a sodalime glass substrate, a non-alkali glass substrate, and the like. In other exemplary embodiments, the upper substrate 410 may include a transparent inorganic material or flexible plastic. For example, the upper substrate 410 may be formed of a transparent resin substrate having flexibility. In this case, at least one inorganic layer and at least one organic layer may be alternately laminated to improve the flexibility of the organic light emitting diode display device 100. The laminated structure may include a first inorganic layer, an organic layer, and a second inorganic layer, for example.

The outermost portion of the display area 10 may be defined as a peripheral area. A sealing member may be disposed in the peripheral area between the lower substrate 110 and the upper substrate 410. In particular, the sealing member may be disposed along the peripheral area and surround the display structure 200. The sealing member may include a frit or the like. In addition, the sealing member may further include a photocurable material. For example, the sealing member may include a mixture of an organic material and a photocurable material, and the sealing member may be formed by curing the mixture after irradiating the mixture with ultraviolet rays (UV), laser light, visible light, or the like. The photocurable material included in the sealing member may include acryl resin, epoxy resin, epoxy acrylate resin, polyester acrylate resin, polyester urethane acrylate oligomer resin, urethane acrylate resin, urethane acrylate oligomer resin, polybutadine acrylate resin, silicon acrylate resin, alkyl acrylate resin, vinyl phenol resin, bismaleimide resin, diallyl phthalate resin, and the like. For example, the mixture may be irradiated with laser light. Upon the irradiation of laser light, the mixture may be changed from a solid state to a liquid state, and the mixture in the liquid state may be cured into the solid state after a predetermined time. The upper substrate 410 may be sealed and coupled to the lower substrate 110 according to the state change of the mixture.

Wirings, such as gate signal wiring, data signal wiring, gate initialization signal wiring, initialization voltage wiring, light emission control signal wiring, and power supply voltage wiring, may be disposed in the peripheral area on the lower substrate 110. A first portion of the wirings may be electrically connected to the display structure 200, and a second portion of the wirings may be electrically connected to the pad electrodes 470. In an exemplary embodiment, a gate driver and a data driver may be disposed in the peripheral area.

As shown in FIGS. 6 and 7, the pad electrodes 470 may be disposed in the pad area 60 on the lower substrate 110. The pad electrodes 470 may be spaced apart from each other in a first direction D1 substantially parallel to the top surface of the lower substrate 110. An area overlapping a portion in which the pad electrodes 470 are disposed may be defined as a first area 61, and an area between two adjacent pad electrodes 470, such as an area where the pad electrodes 470 are not disposed, may be defined as a second area 62. For example, a first length d1 of each of the pad electrodes 470 in a second direction D2 perpendicular to the first direction D1 may be less than about 300 micrometers, and a second length d2 of the pad area 60 in the second direction D2 may be less than about 600 micrometers. In an exemplary embodiment, the first length D1 may be about 200 micrometers.

For example, the pad electrodes 470 may include $1^{st}$ to $n^{th}$ pad electrodes, where n is an integer of 1 or more, and the first to $n^{th}$ pad electrodes may be arranged to be spaced apart from each other at predetermined intervals along the first direction D1 in the pad area 60. The portion in which the $1^{st}$ to $n^{th}$ pad electrodes are disposed may correspond to the first area 61, and a space spaced between the $k^{th}$ and $(k+1)^{th}$ pad electrodes may correspond to the second area 62, where k is an integer between 1 and n.

In addition, as described above, the pad electrodes 470 may be electrically connected to the gate signal wiring, the data signal wiring, the gate initialization signal wiring, the initialization voltage wiring, the light emission control signal wiring, the power supply voltage wiring, or the like disposed in the peripheral area. As shown in FIG. 5, the pad electrodes 470 may electrically connect the display device 100 to an external device 101. For example, the external device 101 may generate a gate signal, a data signal, a gate initialization signal, an initialization voltage, a light emission control signal, a power supply voltage, or the like. The external device 101 may be electrically connected to the display device 100 through the conductive film package 500 and the pad electrodes 470, and may provide the gate signal, the data signal, the gate initialization signal, the initialization voltage, the light emission control signal, the power supply voltage, or the like to the display structure 200.

In addition, the pad electrodes 470 may include metal, an alloy, metal nitride, conductive metal oxide, a transparent conductive material, or the like. These may be used alone or in combination with each other. In other exemplary embodiments, each of the pad electrodes 470 may have a multi-layer structure including a plurality of metal layers. For example, the metal layers may have different thicknesses or include different materials.

Referring back to FIGS. 6 and 7, the insulating layer 460 may be disposed in a portion of the pad area 60 on the lower substrate 110. In particular, the insulating layer 460 may be disposed to surround each of the pad electrodes 470 in the pad area 60. For example, the insulating layer 460 may be disposed in the second area 62 on the lower substrate 110, and may not be disposed in the first area 61. In an exemplary embodiment, the top surface of the insulating layer 460 and the top surface of each of the pad electrodes 470 may be positioned at substantially the same level, without being limited thereto. For example, in other exemplary embodiments, the insulating layer 460 may cover both sides of each of the pad electrodes 470, and the top surface of the insulating layer 460 may be positioned lower or higher than the top surface of each of the pad electrodes 470. The insulating layer 460 may include an organic material or an inorganic material. In an exemplary embodiment, the insulating layer 460 may include an organic material, such as photoresist, polyacryl-based resin, polyimide-based resin, polyamide-based resin, siloxane-based resin, acryl-based resin, and epoxy-based resin.

Referring back to FIGS. 1, 3, 4, 6, and 7, the conductive film package 500 may be disposed to overlap the pad electrodes 470 and the insulating layer 460. The conductive film package 500 may have a configuration, for example, in which an anisotropic conducting film (ACF) and a chip on film (COF) are laminated.

As shown in FIGS. 1, 3, 4, and 7, the base substrate 501 may be positioned on the pad electrodes 470. In an exemplary embodiment, first and second corner portions E1 and E2 of the base substrate 510 may have a curved shape. The first and second corner portions E1 and E2 may be positioned in the pad area 60 on the lower substrate 110. A curvature of each of the first and second corner portions E1 and E2 may be less than about 0.3 R, without being limited thereto. For example, in some exemplary embodiments, the curvature of each of the first and second corner portions E1 and E2 may be about 0.1 R. The base substrate 510 may include a flexible film including a material having flexibility. For example, the base substrate 510 may include polyimide resin, polyester resin, or the like.

For example, in the process of manufacturing the display device 100, a cutting process may be performed to form the first and second corner portions E1 and E2 of the base substrate 510 in a curved shape. By performing the cutting process, the first and second corner portions E1 and E2 may be prevented from being bent. In particular, when the cutting process is not performed, the first and second corner portions E1 and E2 may be bent, which may cause defects in the display device 100. In addition, each of the first and second corner portions E1 and E2 may have a relatively small curvature. For example, when each of the first and second corner portions E1 and E2 has a relatively large curvature, an area in which the film layer 630 is disposed may be relatively reduced, and a corner of the film layer 630 may protrude from the first and second corner portions E1 and E2 of the base substrate 510. Accordingly, the curvature of each of the first and second corner portions E1 and E2 may be formed relatively small. In an exemplary embodiment, the portion in which the first and second corner portions E1 and E2 are positioned may overlap the pad area 60 of the lower substrate 110, and corner portions of the base substrate 510 opposite to the first and second corner portions E1 and E2 may overlap a printed circuit board (PCB), a flexible printed circuit board (FPCB), a flexible flat cable (FFC), or the external device 101.

Although the first and second corner portions E1 and E2 positioned at one side of the base substrate 510 have been described as having the curved shape, the inventive concepts are not limited thereto. For example, in other exemplary embodiments, the corner portions opposite to the first and second corner portions E1 and E2 may also have a curved shape.

In addition, although the base substrate 510 is illustrated as having substantially a rectangular plane shape, the inventive concepts are not limited to a particular shape of the base substrate 510. For example, in some exemplary embodiments, the base substrate 510 may have a triangular plane shape, a circular plane shape, an oval plane shape, a rhombus plane shape, a polygonal plane shape, or a track-like plane shape.

As shown in FIG. 3, the driving integrated circuit 550 may be disposed in a first surface S1 (for example, the top surface) of the base substrate 510. The driving integrated circuit 550 may receive an input signal and a driving IC power supply voltage from the external device 101 of FIG. 5, and the driving integrated circuit 550 may provide an output signal to the display structure 200 based on the input signal. Accordingly, the driving integrated circuit 550 may control a driving of the display structure 200. The driving integrated circuit 550 may be electrically connected to the bump electrodes 520. In other exemplary embodiments, the driving integrated circuit 550 may be mounted in the pad area 60 of the lower substrate 110.

As shown in FIGS. 4, 6 and 7, the bump electrodes 520 may be spaced apart from each other on a second surface S2 (for example, a bottom surface) of the base substrate 510. In an exemplary embodiment, a first end of each of the bump electrodes 520 may overlap the film layer 630, and the bump electrodes 520 may extend in the second direction D2. A second end opposite to the first end of each of the bump electrodes 520 may not overlap the film layer 630. A portion of the base substrate 510, in which the bump electrodes 520 overlaps the film layer 630, is defined as a first portion of the base substrate 510. In addition, a portion of the base substrate 510 positioned at both sides of the first portion, such as a portion adjacent to the first and second corner portions E1 and E2, is defined as a second portion of the base substrate 510.

A first portion of each of the bump electrodes 520 may be positioned to overlap the pad electrodes 470, and may be electrically connected to pad electrodes 470. In addition, a second portion of each of the bump electrodes 520 may overlap the PCB, FPCB, FFC, or external device 101, and may be electrically connected to the PCB, FPCB, FFC, or external device 101. Each of the bump electrodes 520 may overlap each of the pad electrodes 470 in the first area 61, and may be electrically connected to the pad electrodes 470 through the conductive balls 600, for example, the first conductive balls 610. Each of the bump electrodes 520 may include metal, an alloy, a metal nitride, a conductive metal oxide, a transparent conductive material, and the like. These may be used alone or in combination with each other. In other exemplary embodiments, each of the bump electrodes 520 may have a multi-layer structure including a plurality of metal layers. For example, the metal layers may have different thicknesses or include different materials.

Although the first end and the second end of each of the bump electrodes 520 have been described as being integrated with each other, the inventive concepts are not limited thereto. For example, the first end and the second end of each of the bump electrodes 520 may be spaced apart from each other in the second direction D2. In this case, the first end may be electrically connected to one side of the driving integrated circuit 550, and the second end may be electrically connected to the other side of the driving integrated circuit 550.

As shown in FIG. 4, the metal patterns 580 may be disposed in the second portion of the base substrate 510.

The alignment pattern 571 of the metal patterns 580 may be disposed adjacent to the first and second corner portions E1 and E2. In an exemplary embodiment, the alignment pattern 571 may include a first alignment portion disposed adjacent to the first corner portion E1 and a second alignment portion disposed adjacent to the second corner portion E2. For example, in the process of manufacturing the display device 100, the alignment patterns 571 may assist forming of the film layer 630, such that the film layer 630 is accurately formed in the first portion and the second portion on the second surface S2 of the base substrate 510. In particular, at least one corner of the film layer 630 may be aligned with a corner of the alignment pattern 571.

Although the alignment pattern 571 has been described as including two alignment portions, the inventive concepts are not limited thereto. For example, the alignment pattern 571 may include one or more than two alignment portions.

The adhesive pattern 591 may be positioned adjacent to the alignment pattern 571, and may be disposed in parallel with the bump electrodes 520. In some exemplary embodiments, however, the adhesive pattern 591 may not be disposed in parallel with the bump electrodes 520, but be arranged by being rotated at a predetermined angle. In an exemplary embodiment, the adhesive pattern 591 may include first adhesive portions positioned adjacent to the first alignment portion, and second adhesive portions positioned adjacent to the second alignment portion. For example, in the process of manufacturing the display device 100, the adhesive pattern 591 may be formed in the second portion on the second surface S2 of the base substrate 510 to increase adhesive strength between the base substrate 510 and the film layer 630. In addition, in the process of bonding the conductive film package 500 to the pad area 60 of the lower substrate 110, pressure may be applied from the upper substrate 410 to the lower substrate 110 after contacting the conductive film package 500 with the pad electrodes 470. In this case, an uncured resin layer, such as the film layer 630, positioned in the second portion of the base substrate 510 may reflow, and the adhesive pattern 591 may function as a dam to reduce an amount of reflow.

Although the adhesive pattern 591 is illustrated as including six adhesive portions, the inventive concepts are not limited to a particular number of the adhesive portions. For example, in some exemplary embodiments, the adhesive pattern 591 may include at least two adhesive portions.

Each of the metal patterns 580 may include metal, an alloy, metal nitride, conductive metal oxide, a transparent conductive material, or the like. For example, each of the metal patterns 580 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, aluminum nitride (AlN), an alloy containing silver, tungsten nitride (WN), an alloy containing copper, an alloy containing molybdenum, titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), and the like. These may be used alone or in combination with each other. In other exemplary embodiments, each of the metal patterns 580 may have a multi-layer structure including a plurality of metal layers. For example, the metal layers may have different thicknesses or include different materials.

As shown in FIGS. 6 and 7, the conductive balls 600 may be disposed in the film layer 630. In an exemplary embodiment, the conductive balls 600 disposed in the first area 61 and the second area 62 may have different shapes from each other. For example, each of the first conductive balls 610 positioned in the first area 61 may have an oval plane shape, and each of the second conductive balls 620 positioned in the second area 62 may have a circular plane shape. In addition, each of the conductive balls 600 disposed in the remaining areas of the film layer 630, except for the first area 61 and the second area 62 may have a circular plane shape, and the second conductive balls 620 may be positioned therein. For example, during the process of bonding the conductive film package 500 to the pad area 60 of the lower substrate 110 in the process of manufacturing the display device 100, pressure may be applied from the upper substrate 410 to the lower substrate 110 after the conductive film package 500 comes into contact with the pad electrodes 470. In this case, a distance between each of the pad electrodes 470 and each of the bump electrodes 520 may be reduced, and a shape of each of the conductive balls 600 positioned in the first area 61 may be transformed.

Figure 13:
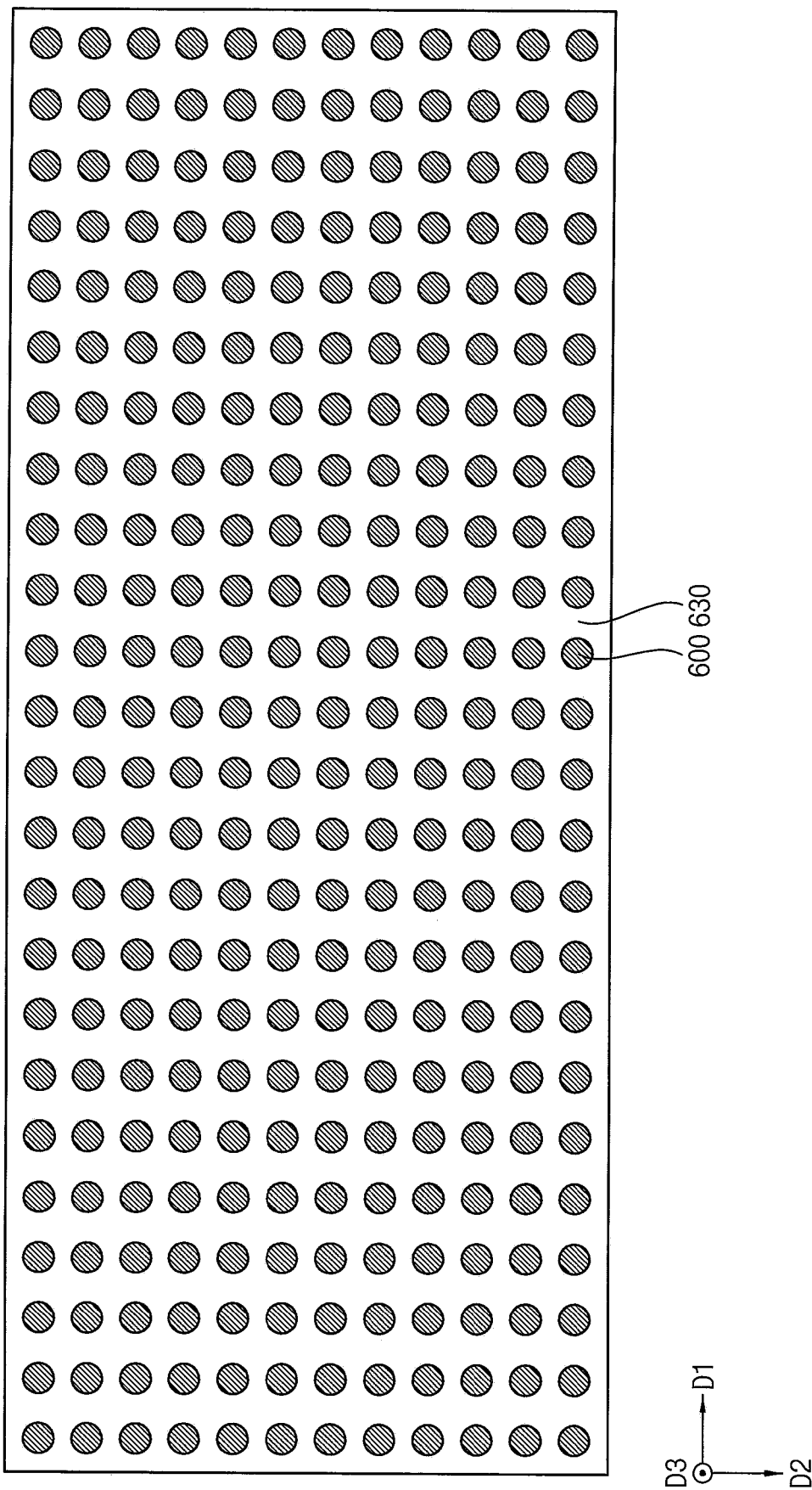

The conductive balls 600 may be arranged in the first direction D1 and the second direction D2 on the pad electrodes 470 and the insulating layer 460, and may be spaced apart from each other at substantially the same intervals (see FIG. 13). In particular, the conductive balls 600 may be arranged in only one layer, and may not overlap each other in a third direction D3 perpendicular to the first direction D1 and the second direction D2. In some exemplary embodiments, the conductive balls 600 may be arranged in a plurality of layers or randomly arranged.

As shown in FIG. 7, the first conductive balls 610 may be disposed in the first area 61 between the pad electrodes 470 and the bump electrodes 520, and the second conductive balls 620 may be disposed in the second area 62. A diameter of each of the first conductive balls 610 in the third direction D3 may be less than a diameter of each of the second conductive balls 620 in the third direction D3. In an exemplary embodiment, at least a part of each of the first conductive balls 610 may come into direct contact with the pad electrodes 470 and the bump electrodes 520. In this case, the film layer 630 may expose a part of the first conductive balls 610. Each of the conductive balls 600 may have a structure in which a metal layer, such as nickel, cobalt, gold, silver, and copper, is coated on spherical polymer.

Although the conductive balls according to the illustrated exemplary embodiment have been described as being arranged in a lattice shape, the inventive concepts are not limited thereto. For example, in other exemplary embodiments, the conductive balls may be arranged in a rectangular or rhombus shape on a plane.

Further, although the conductive balls 600 according to the illustrated exemplary embodiment have been described as having a circular plane shape or an oval plane shape, the inventive concepts are not limited to particular shapes of the conductive balls. For example, in other exemplary embodiments, the conductive balls may have a triangular plane shape, a rectangular plane shape, a rhombus plane shape, a polygonal plane shape, or a track-like plane shape.

As shown in FIGS. 4, 6 and 7, the film layer 630 may be disposed to overlap the pad electrodes 470, a part of the bump electrodes 520, and the metal patterns 580 between the base substrate 510 and the lower substrate 110. The film layer 630 may partially cover the conductive balls 600. In particular, the film layer 630 may be disposed in the first portion and the second portion of the base substrate 510, and a bottom surface of the film layer 630 may come into contact with the pad electrodes 470 and the insulating layer 460. In an exemplary embodiment, the film layer 630 disposed in the first area 61 and the second area 62 may have different thicknesses. For example, the film layer 630 may have a first thickness in the first area 61, and may expose at least a part of each of the first conductive balls 610. In addition, the film layer 630 may have a second thickness greater than the first thickness in the second area 62, and may cover the second conductive balls 620 in the second area 62. In addition, as described above, at least one of the corners of the film layer 630 may be aligned with the corner of the alignment pattern 571. In addition, the film layer 630 may cover the adhesive pattern 591.

The film layer 630 may include thermosetting resin or photocurable resin. For example, the film layer 630 may include epoxy resin, amino resin, phenol resin, urea resin, melamine resin, unsaturated polyester resin, polyurethane resin, polyimide resin, and the like.

In general, the length of the pad area 60 in the second direction D2 may be reduced so as to reduce a dead space of a conventional display device. For example, the length of the pad area 60 may be about 0.5 mm or less. In this case, the length of each of the pad electrodes 470 in the second direction D2 may also be reduced. For example, the length of each of the pad electrodes 470 in the second direction D2 may be 0.3 mm or less. The ACF and FPCB, for example, COF, may be disposed on the pad electrodes 470 so as to be electrically connected to the external device 101. The ACF may bond the pad electrodes 470 to the FPCB, and the pad electrodes 470 may be electrically connected to the FPCB through the conductive balls included in the ACF. However, the ACF cannot be manufactured to have a length of 0.6 mm or less in the second direction D2 because of the manufacturing process (e.g., a cutting margin of the ACF). In other words, it is difficult to form the ACF on the pad electrodes 470 due to the reduced length of the pad area 60, such as the first length d1.

In an exemplary embodiment, after the film layer 630 is formed on the bottom surface of the base substrate 510, the conductive film package 500 is formed on the pad electrodes 470, so that the pad electrodes 470 may be electrically connected to the external device 101 through the conductive film package 500, even when the second length d2 of the pad area 60 of the display device 100 is reduced to about 0.5 mm.

In addition, the conductive film package 500 may include the base substrate 510 including first and second corner portions E1 and E2 having relatively small curvatures, and the alignment pattern 571 positioned adjacent to the first and second corner portions E1 and E2, so that the film layer 630 may be easily formed in the second surface S2 of the base substrate 510.

Further, the conductive film package 500 may include the adhesive pattern 591, so that the adhesive strength between the base substrate 510 and the film layer 630 may be relatively increased in the second portion of the base substrate 510, and the amount of reflow of the uncured resin layer may be reduced during the process of bonding the conductive film package 500 to the pad area 60 of the lower substrate 110. Accordingly, the display device 100 according to the exemplary embodiments may have a relatively reduced pad area 60.

Figure 8:
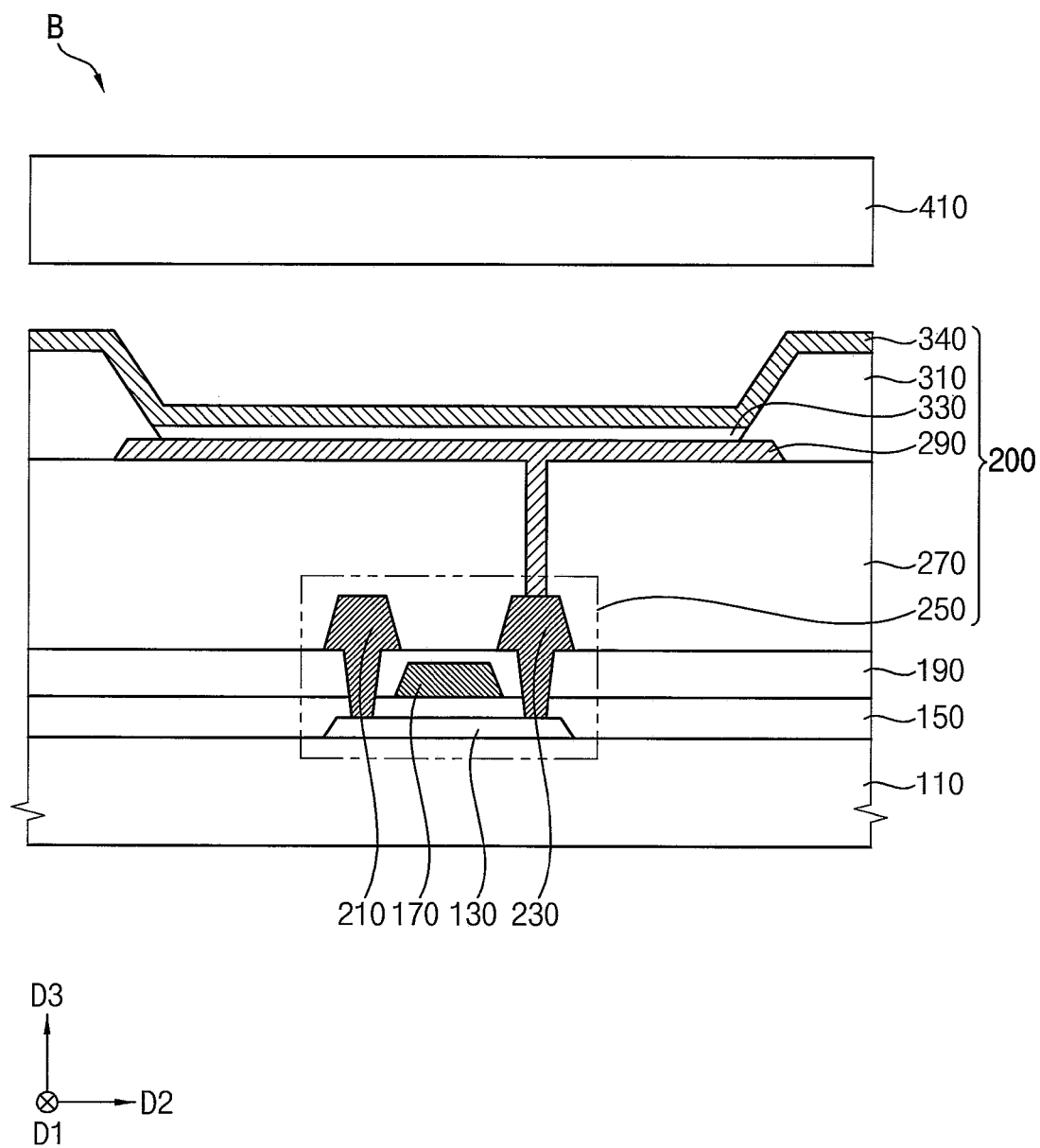
FIG. 8 is a partially enlarged cross-sectional view showing area 'B' of FIG. 5.

FIG. 8 is a partially enlarged cross-sectional view showing area 'B' of FIG. 5.

Referring to FIG. 8, the display structure 200 may include a semiconductor element 250, a planarization layer 270, a pixel defining layer 310, a lower electrode 290, a light emitting layer 330, and an upper electrode 340. The semiconductor element 250 may include an active layer 130, a gate insulating layer 150, a gate electrode 170, an insulating interlayer 190, a source electrode 210, and a drain electrode 230. The display structure 200 may be disposed in the display area 10 between the lower substrate 110 and the upper substrate 410.

In some exemplary embodiments, a buffer layer may be disposed on the lower substrate 110. The buffer layer may be disposed entirely over the lower substrate 110. The buffer layer may prevent metal atoms or impurities from being diffused from the lower substrate 110, and may enable a substantially uniform active layer 130 to be obtained by adjusting the heat transfer rate during the crystallization process for forming the active layer 130. In addition, when the surface of the lower substrate 110 is not uniform, the buffer layer may improve the flatness of the surface of the lower substrate 110. Depending on a type of substrate 110, in some exemplary embodiments, at least two buffer layers may be provided on the substrate 110, or the buffer layer may not be disposed thereon. The buffer layer may include a silicon compound, metal oxide, or the like.

The active layer 130 may be disposed on the lower substrate 110, and the active layer 130 may include an oxide semiconductor, an inorganic semiconductor, such as amorphous silicon and poly silicon, an organic semiconductor, or the like. The active layer 130 may have a source area and a drain area.

The gate insulating layer 150 may be disposed on the active layer 130. The gate insulating layer 150 may cover the active layer 130, and may be disposed on the lower substrate 110. For example, the gate insulating layer 150 may sufficiently cover the active layer 130, and may have a substantially planar upper surface without generating a step around the active layer 130. In some exemplary embodiments, the gate insulating layer 150 may cover the active layer 130 on the lower substrate 110, and be disposed to have a uniform thickness along a profile of the active layer 130. The gate insulating layer 150 may include silicon compound, metal oxide, or the like. For example, the gate insulating layer 150 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like. In other exemplary embodiments, the gate insulating layer 150 may have a multi-layer structure including a plurality of insulating layers. For example, the insulating layers may have different thicknesses or include different materials.

The gate electrode 170 may be disposed on a portion of the gate insulating layer 150, under which the active layer 130 is positioned. The gate electrode 170 may include metal, an alloy, metal nitride, conductive metal oxide, a transparent conductive material, or the like. These may be used alone or in combination with each other. In other exemplary embodiments, the gate electrode 170 may have a multi-layer structure including a plurality of metal layers. For example, the metal layers may have different thicknesses or include different materials.

An insulating interlayer 190 may be disposed on the gate electrode 170. The insulating interlayer 190 may cover the gate electrode 170, and may be disposed on the gate insulating layer 150. For example, the insulating interlayer 190 may sufficiently cover the gate electrode 170 on the gate insulating layer 150, and may have a substantially planar upper surface without generating a step around the gate electrode 170. In some exemplary embodiments, the insulating interlayer 190 may be disposed to have a uniform thickness along a profile of the gate electrode 170 while covering the gate electrode 170 on the gate insulating layer 150. The insulating interlayer 190 may include silicon compound, metal oxide, or the like. In other exemplary embodiments, the insulating interlayer 190 may have a multi-layer structure including a plurality of insulating layers. For example, the insulating layers may have different thicknesses or include different materials.

The source electrode 210 and the drain electrode 230 may be disposed on the insulating interlayer 190. The source electrode 210 and the drain electrode 230 may be connected to the source area and the drain area of the active layer 130 through a contact hole formed by removing a part of the gate insulating layer 150 and the insulating interlayer 190, respectively. Each of the source electrode 210 and the drain electrode 230 may include metal, an alloy, metal nitride, conductive metal oxide, a transparent conductive material, or the like. These may be used alone or in combination with each other. In other exemplary embodiments, the source electrode 210 and the drain electrode 230 may have a multi-layer structure including a plurality of metal layers. For example, the metal layers may have different thicknesses or include different materials.

Accordingly, a semiconductor element 250 including the active layer 130, the gate insulating layer 150, the gate electrode 170, the insulating interlayer 190, the source electrode 210, and the drain electrode 230 may be formed.

Although the semiconductor element 250 according to the illustrated exemplary embodiment has been described as having an upper gate structure, the inventive concepts are not limited thereto. For example, in some exemplary embodiments, the semiconductor element 250 may have a bottom gate structure or a double gate structure.

The planarization layer 270 may be disposed on the source electrode 210 and the drain electrode 230. The planarization layer 270 may cover the source electrode 210 and the drain electrode 230. In particular, the planarization layer 270 may be disposed entirely over the insulating interlayer 190. In an exemplary embodiment, the planarization layer 270 may be disposed to have a relatively thick thickness to sufficiently cover the source electrode 210 and the drain electrode 230. In this case, the planarization layer 270 may have a substantially planar upper surface, and a planarization process may be added to the planarization layer 270 to implement the above planar upper surface of the planarization layer 270. In some exemplary embodiments, the planarization layer 270 may be disposed to have a uniform thickness along profiles of the source electrode 210 and the drain electrode 230 while covering the source electrode 210 and the drain electrode 230. The planarization layer 270 may be formed of an organic material or an inorganic material. In an exemplary embodiment, the planarization layer 270 may include an organic material.

The lower electrode 290 may be disposed on the planarization layer 270. The lower electrode 290 may be connected to the drain electrode 230 through a contact hole formed by removing a part of the planarization layer 270. In addition, the lower electrode 290 may be electrically connected to the semiconductor element 250. The lower electrode 290 may include metal, an alloy, metal nitride, conductive metal oxide, a transparent conductive material, or the like. These may be used alone or in combination with each other. In other exemplary embodiments, the lower electrode 290 may have a multi-layer structure including a plurality of metal layers. For example, the metal layers may have different thicknesses or include different materials.

The pixel defining layer 310 may be disposed on the planarization layer 270, and may expose a part of the top surface of the lower electrode 290. The pixel defining layer 310 may be formed of an organic material or an inorganic material. In an exemplary embodiment, the pixel defining layer 310 may include an organic material.

The light emitting layer 330 may be disposed on a portion of the exposed lower electrode 290. The light emitting layer 330 may be formed using at least one of light emitting materials capable of emitting color lights, such as red light, green light, and blue light, that are different according to sub-pixels. In some exemplary embodiments, the light emitting layer 330 may be formed by laminating a plurality of light emitting materials capable of generating different color lights, such as red light, green light, and blue light, so as to emit white light. In this case, the color filter may be disposed on the light emitting layer 330. The color filter may include at least one of a red color filter, a green color filter, and a blue color filter. In some exemplary embodiments, the color filter also may include a yellow color filter, a cyan color filter, and a magenta color filter. The color filter may include photosensitive resin or color photoresist.

The upper electrode 340 may be disposed on the pixel defining layer 310 and the light emitting layer 330. The upper electrode 340 may include metal, an alloy, metal nitride, conductive metal oxide, a transparent conductive material, or the like. In other exemplary embodiments, The upper electrode 340 may have a multi-layer structure including a plurality of metal layers. For example, the metal layers may have different thicknesses or include different materials.

Although the display device 100 according to the exemplary embodiments has been described as an organic light emitting display device, the inventive concepts are not limited thereto. In other exemplary embodiments, the display device 100 may include a liquid crystal display device (LCD), a field emission display (FED), a plasma display panel (PDP), or an electrophoretic display device (EPD).

Figure 9:
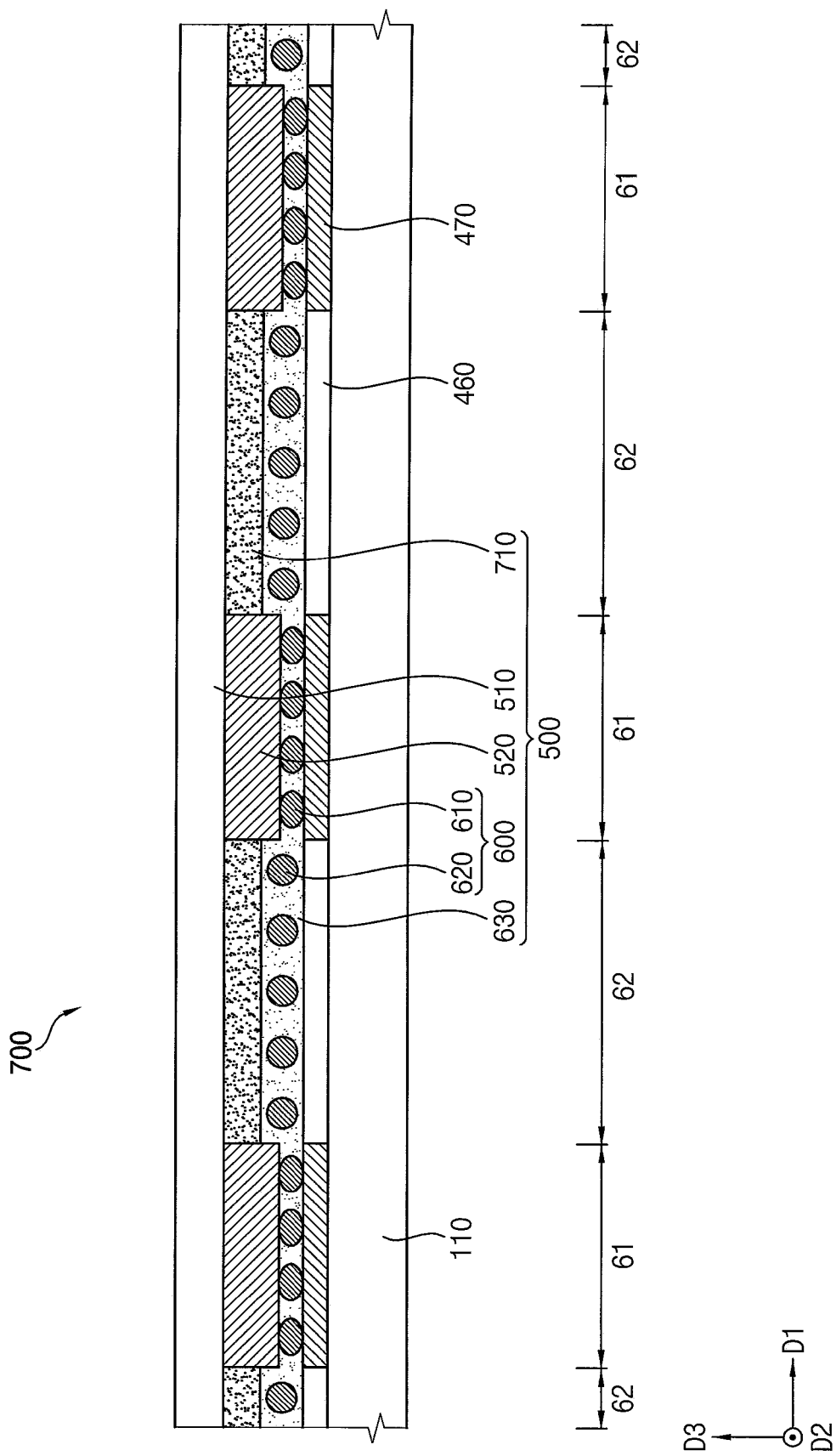
FIG. 9 is a cross-sectional view showing the display device according to an exemplary embodiment.

FIG. 9 is a cross-sectional view showing the display device according to another exemplary embodiment. The display device 700 illustrated in FIG. 9 may have a configuration substantially the same as or similar to the display device 100 described with reference to FIGS. 1 to 8, except for the second film layer 710. As such, repeated descriptions of components substantially the same as or similar to the components already described above will be omitted.

Referring to FIGS. 6 and 7, the display device 700 may include a lower substrate 110, a display structure 200, an upper substrate 410, an insulating layer 460, pad electrodes 470, a conductive film package 500, and the like. The lower substrate 110 may include a display area 10 and a pad area 60 positioned at one side of the display area 10. The conductive film package 500 may include a base substrate 510, bump electrodes 520, metal patterns 580, a driving integrated circuit 550, conductive balls 600, s first film layer 630, and a second film layer 710. In addition, the metal patterns 580 may include an alignment pattern 571 and an adhesive pattern 591, and the conductive balls 600 may include first conductive balls 610 and second conductive balls 620.

The second film layer 710 may be disposed in the second area 62 and a part of the pad area 60 on the insulating layer 460. In particular, the second film layer 710 may be interposed between the base substrate 510 and the first film layer 630. For example, the second film layer 710 may come into direct contact with a top surface of the first film layer 630, both side surfaces of each of the bump electrodes 520, and a bottom surface of the base substrate 510. In addition, the conductive balls 600 may not be disposed inside the second film layer 710. The base substrate 510 and the first film layer 630 may firmly adhere to each other by the second film layer 710. The second film layer 710 may include thermosetting resin or photocurable resin. For example, the second film layer 710 may include acrylic resin, epoxy resin, epoxy acrylate resin, polyester acrylate resin, polyester urethane acrylate oligomer resin, urethane acrylate resin, urethane acrylate oligomer resin, polybutadiene acrylate resin, silicone acrylate resin, alkyl acrylate resin, vinylphenol resin, bismaleimide resin, diallyl phthalate resin, and the like.

The display device 700 according to the illustrated exemplary embodiment may include the second film layer 710, so that adhesive strength between the base substrate 510 and the first film layer 630 may be increased. In addition, the second film layer 710, which does not include the conductive balls 600, may be disposed between the bump electrodes 520 in the first area 61, so that adjacent bump electrodes 520 may be prevented from being shorted.

FIGS. 10 to 19 are views illustrating a method of manufacturing the display device according to an exemplary embodiment. For example, FIGS. 10, 11, 14, 15, 16, 17, 18, and 19 may be cross-sectional views of the display device, and FIGS. 12 and 13 may be plan views of the display device.

Figure 10:
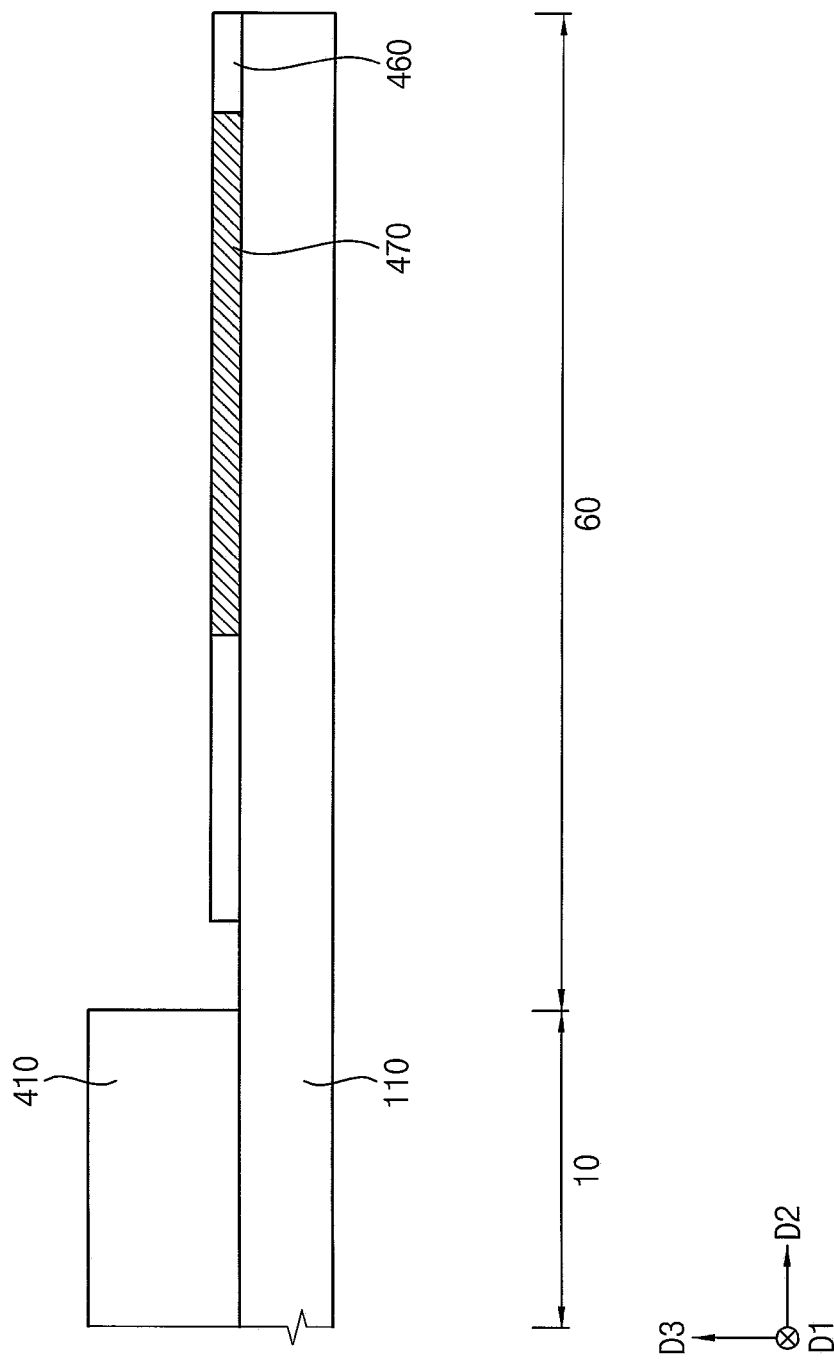
Figure 11:
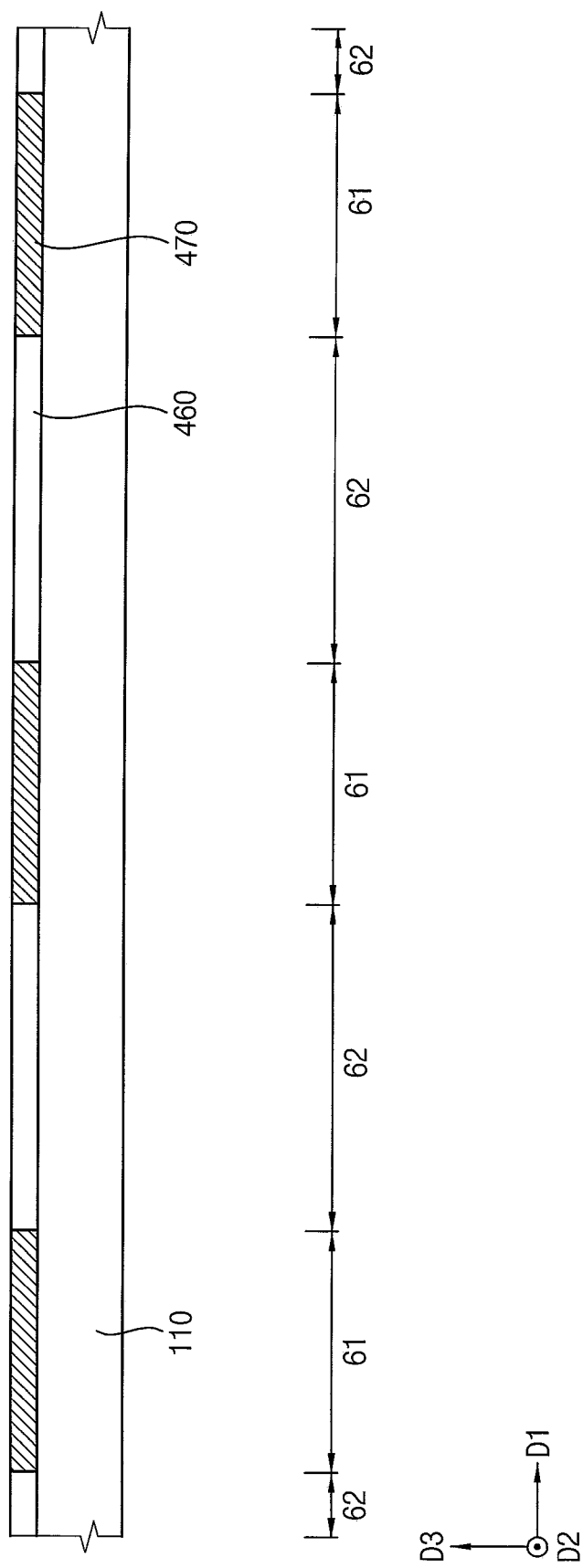

Referring to FIGS. 8, 10 and 11, the lower substrate 110 including a transparent or opaque material may be provided. The lower substrate 110 may be formed using a quartz substrate, a synthetic quartz substrate, a calcium fluoride substrate, a fluorine-doped quartz substrate, a sodalime glass substrate, a non-alkali glass substrate, or the like.

The active layer 130 may be formed in the display area 10 on the lower substrate 110, and the active layer 130 may be formed using a metal oxide semiconductor, an inorganic semiconductor, or an organic semiconductor. The active layer 130 may have a source area and a drain area.

The gate insulating layer 150 may be formed on the active layer 130. The gate insulating layer 150 may cover the active layer 130, and may be formed on the lower substrate 110. For example, the gate insulating layer 150 may sufficiently cover the active layer 130, and may have a substantially planar upper surface without generating a step around the active layer 130. In some exemplary embodiments, the gate insulating layer 150 may be formed to have a uniform thickness along the profile of the active layer 130 while covering the active layer 130 on the lower substrate 110. The gate insulating layer 150 may be formed using silicon compound, metal oxide, or the like. For example, the gate insulating layer 150 may include SiO, SiN, SiON, SiOC, SiCN, SiOC, AlO, AlN, TaO, HfO, ZrO, and TiO.

The gate electrode 170 may be formed on a portion of the gate insulating layer 150, under which the active layer 130 is disposed. The gate electrode 170 may be formed by using metal, an alloy, a metal nitride, a conductive metal oxide, a transparent conductive material, or the like. These may be used alone or in combination with each other.

The insulating interlayer 190 may be formed on the gate electrode 170. The insulating interlayer 190 may cover the gate electrode 170 and be formed on the gate insulating layer 150. For example, the insulating interlayer 190 may sufficiently cover the gate electrode 170 on the gate insulating layer 150, and may have a substantially planar upper surface without generating a step around the gate electrode 170. In some exemplary embodiments, the insulating interlayer 190 may be formed to have a uniform thickness along the profile of the gate electrodes 170 while covering the gate electrode 170 on the gate insulating layer 150. The insulating interlayer 190 may include a silicon compound, metal oxide, and the like.

The source electrode 210 and the drain electrode 230 may be formed on the insulating interlayer 190. The source electrode 210 and the drain electrode 230 may be connected to the source area and the drain area of the active layer 130 through a contact hole formed by removing a part of the gate insulating layer 150 and the insulating interlayer 190, respectively. Each of the source electrode 210 and the drain electrode 230 may be formed by using metal, an alloy, a metal nitride, a conductive metal oxide, a transparent conductive material, or the like. These may be used alone or in combination with each other.

Accordingly, the semiconductor element 250 including the active layer 130, the gate insulating layer 150, the gate electrode 170, the insulating interlayer 190, the source electrode 210, and the drain electrode 230 may be formed.

The planarization layer 270 may be formed on the source electrode 210 and the drain electrode 230. The planarization layer 270 may cover the source electrode 210 and the drain electrode 230. In particular, the planarization layer 270 may be formed entirely over the insulating interlayer 190. In an exemplary embodiment, the planarization layer 270 may be formed to have a relatively thick thickness to sufficiently cover the source electrode 210 and the drain electrode 230. In this case, the planarization layer 270 may have a substantially planar upper surface, and a planarization process may be added to the planarization layer 270. In some exemplary embodiments, the planarization layer 270 may be formed to have a uniform thickness along profiles of the source electrode 210 and the drain electrode 230 while covering the source electrode 210 and the drain electrode 230. The planarization layer 270 may be formed using an organic material.

The lower electrode 290 may be formed on the planarization layer 270 to implement the above planar upper surface of the planarization layer 270. The lower electrode 290 may be connected to the drain electrode 230 through a contact hole formed by removing a part of the planarization layer 270. In addition, the lower electrode 290 may be electrically connected to the semiconductor element 250. The lower electrode 290 may be formed by using metal, an alloy, a metal nitride, a conductive metal oxide, a transparent conductive material, or the like. These may be used alone or in combination with each other.

The pixel defining layer 310 may be formed on the planarization layer 270, which may expose a part of the top surface of the lower electrode 290. The pixel defining layer 310 may be formed using an organic material.

The light emitting layer 330 may be formed on the exposed portion of the lower electrode 290. The light emitting layer 330 may be formed using at least one of light emitting materials capable of emitting color lights, such as red light, green light, and blue light, that are different according to sub-pixels. In some exemplary embodiments, the light emitting layer 330 may be formed by laminating a plurality of light emitting materials capable of generating different color lights, such as red light, green light, and blue light, to emit white light. In this case, a color filter may be formed on the light emitting layer 330. The color filter may include at least one of a red color filter, a green color filter, and a blue color filter. In some exemplary embodiments, the color filter also may include a yellow color filter, a cyan color filter, and a magenta color filter. The color filter may be formed by using photosensitive resin or color photoresist.

The upper electrode 340 may be formed on the pixel defining layer 310 and the light emitting layer 330. The upper electrode 340 may be formed by using metal, an alloy, a metal nitride, a conductive metal oxide, a transparent conductive material, or the like.

Accordingly, the display structure 200 including the semiconductor element 250, the planarization layer 270, the pixel defining layer 310, the lower electrode 290, the light emitting layer 330, and the upper electrode 340 may be provided.

The pad electrodes 470 may be formed in the pad area 60 on the lower substrate 110. The pad electrodes 470 may be spaced apart from each other in a first direction D1 substantially parallel to the top surface of the lower substrate 110. As shown in FIG. 11, a portion in which the pad electrodes 470 are formed may be defined as a first area 61, and an area between two adjacent pad electrodes 470 among the pad electrodes 470 may be defined as a second area 62. For example, referring back to FIG. 6, the first length d1 of the pad electrodes 470 may be about 200 micrometers, and the second length d2 of the pad area 60 may be less than about 600 micrometers. The pad electrodes 470 may be formed by using metal, an alloy, a metal nitride, a conductive metal oxide, a transparent conductive material, or the like. These may be used alone or in combination with each other. In some exemplary embodiments, the pad electrodes 470, the gate electrode 170, and/or the source and drain electrodes 210 and 230 may be simultaneously formed using the same material.

The insulating layer 460 may be formed in a part of the pad area 60 on the lower substrate 110. In particular, the insulating layer 460 may be formed to surround each of the pad electrodes 470 in the pad area 60. For example, the insulating layer 460 may be formed in the second area 62 on the lower substrate 110, and may not be formed in the first area 61. In an exemplary embodiment, the top surface of the insulating layer 460 and the top surface of each of the pad electrodes 470 may be positioned at substantially the same level. In other exemplary embodiments, the insulating layer 460 may cover both sides of each of the pad electrodes 470, and the top surface of the insulating layer 460 may be positioned lower or higher than the top surface of each of the pad electrodes 470. The insulating layer 460 may be formed using an organic material. For example, the insulating layer 460 may include photoresist, polyacryl-based resin, polyimide-based resin, polyamide-based resin, siloxane-based resin, acryl-based resin, epoxy-based resin, and the like. In an exemplary embodiment, the insulating layer 460 and the planarization layer 270 may be simultaneously formed using the same material.

Figure 12:
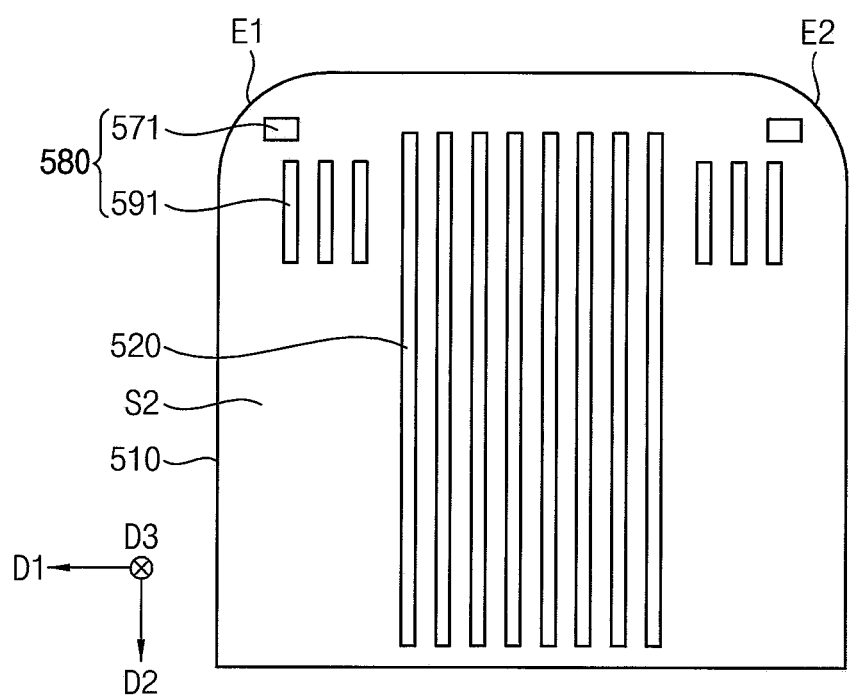

Referring to FIG. 12, the upper substrate 410 may be provided. The upper substrate 410 may include substantially the same material as the lower substrate 110. For example, the upper substrate 410 may be formed using a quartz substrate, a synthetic quartz substrate, a calcium fluoride substrate, a fluorine-doped quartz substrate, a sodalime glass substrate, a non-alkali glass substrate, or the like.

The sealing member may be formed on the bottom surface of the upper substrate 410. The sealing member may be formed at the outermost portion of the upper substrate 410. The sealing member may be formed using a frit or the like. In addition, the sealing member may further include a photocurable material. For example, the sealing member may include a mixture of an organic material and a photocurable material.

After the sealing member is formed on the bottom surface of the upper substrate 410, the upper substrate 410 may be positioned on the lower substrate 110 and the display structure 200, such that the sealing member surrounds the display structure 200.

After the upper substrate 410 is positioned on the lower substrate 110, the sealing member may be irradiated with ultraviolet rays, laser light, visible light, or the like to cure the sealing member. For example, the mixture may be irradiated with laser light. Upon irradiation of laser light, the mixture may be changed from a solid state to a liquid state, and the mixture in the liquid state may be cured into the solid state after a predetermined time. The upper substrate 410 may be sealed and coupled to the lower substrate 110 according to the state change of the mixture.

Referring to FIG. 12, the base substrate 510 may be provided. In an exemplary embodiment, first and second corner portions E1 and E2 of the base substrate 510 may be formed to have a curved shape. A curvature of each of the first and second corner portions E1 and E2 may be less than about 0.3 R. In other exemplary embodiments, a curvature of each of the first and second corner portions E1 and E2 may be formed to be about 0.1 R. The base substrate 510 may be formed using a flexible film including a material having flexibility. For example, the base substrate 510 may include polyimide resin, polyester resin, and the like. The driving integrated circuit 550 may be formed on the first surface S1 of the base substrate 510 (see FIG. 3).

The bump electrodes 520 may be spaced apart from each other on the second surface S2, for example, a bottom surface of the base substrate 510. The bump electrodes 520 may extend in the second direction D2. Each of the bump electrodes 520 may be formed by using metal, an alloy, a metal nitride, a conductive metal oxide, a transparent conductive material, or the like. These may be used alone or in combination with each other.

The alignment pattern 571 may be formed to be adjacent to the first and second corner portions E1 and E2. In an exemplary embodiment, the alignment pattern 571 may include a first alignment portion formed adjacent to the first corner portion E1 and a second alignment portion formed adjacent to the second corner portion E2.

The adhesive pattern 591 may be positioned adjacent to the alignment pattern 571, and may be formed substantially in parallel with the bump electrodes 520. In an exemplary embodiment, the adhesive pattern 591 may include first adhesive portions positioned adjacent to the first alignment portion and second adhesive portions positioned adjacent to the second alignment portion.

Accordingly, metal patterns 580 including the alignment pattern 571 and the adhesive pattern 591 may be formed.

Each of the metal patterns 580 may be formed by using metal, an alloy, a metal nitride, a conductive metal oxide, a transparent conductive material, or the like. For example, each of the metal patterns 580 may include Au, Ag, Al, Pt, Ni, Ti, Pd, Mg, Ca, Li, Cr, Ta, W, Cu, Mo, Sc, Nd, Ir, an alloy containing aluminum, AlN, an alloy containing silver, WN, an alloy containing copper, an alloy containing molybdenum, TiN, CrN, TaN, SrRuO, ZnO, ITO, SnO, InO, GaO, IZO, and the like. These may be used alone or in combination with each other.

Referring to FIG. 13, the first film layer 630 may be provided, and the conductive balls 600 may be positioned inside the first film layer 630.

The first film layer 630 may cover the conductive balls 600. The first film layer 630 may be formed using a non-cured resin layer having conductive balls 600 arranged therein. For example, the non-cured resin layer may include non-cured epoxy resin, non-cured amino resin, non-cured phenol resin, non-cured urea resin, non-cured melamine resin, an uncured unsaturated polyester resin, non-cured polyurethane resin, non-cured polyimide resin, or the like.

Each of the conductive balls 600 may have substantially a circular plane shape. The conductive balls 600 may be arranged inside the first film layer 630 in the first direction D1 and the second direction D2, and may be regularly spaced apart from each other at substantially the same intervals. In particular, the conductive balls 600 may be arranged to have a lattice shape in only one layer, and may not overlap each other in a third direction D3 perpendicular to the first direction D1 and the second direction D2. Each of the conductive balls 600 may have a structure in which a metal layer, such as nickel, cobalt, gold, silver, and copper, is coated on spherical polymer.

Figure 14:
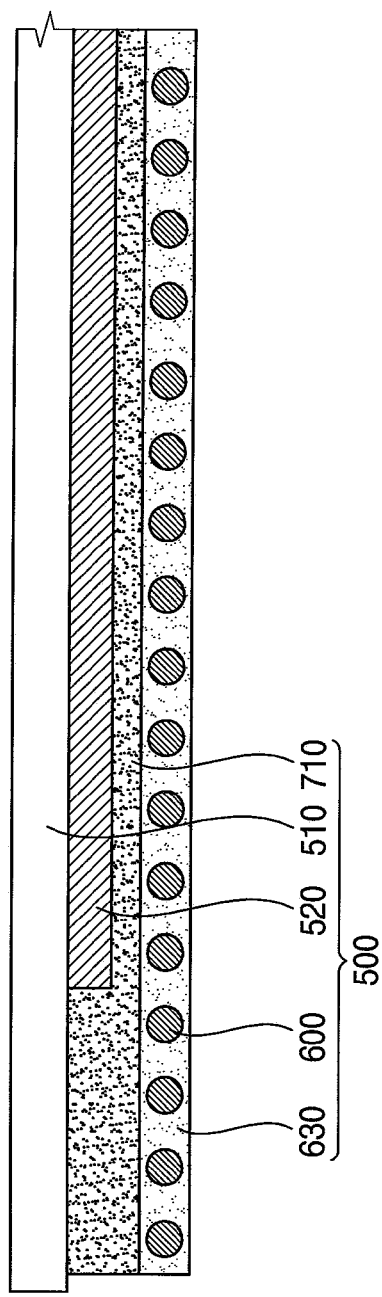
Figure 15:
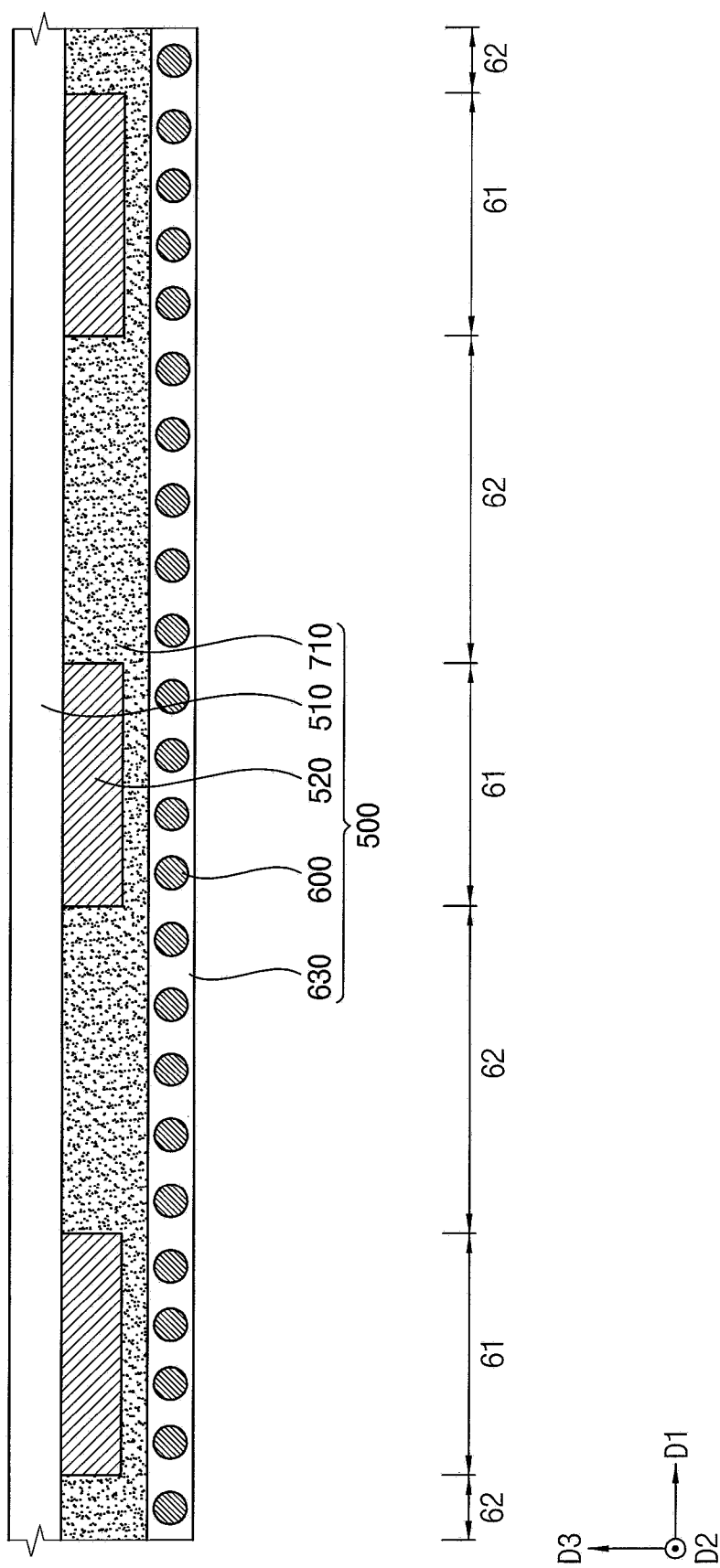

Referring to FIGS. 14 and 15, the second film layer 710 may be formed on the second surface S2 of the base substrate 510. The second film layer 710 may cover the metal patterns 580 and a portion of the bump electrodes 520 on the second surface S2. The conductive balls 600 may not be arranged inside the second film layer 710. In particular, the second film layer 710 may be formed using a non-cured resin layer, in which conductive balls 600 are not arranged.

After the second film layer 710 is formed, the first film layer 630 having conductive balls 600 arranged therein may be formed on a bottom surface of the second film layer 710.

Accordingly, the conductive film package 500, which includes the base substrate 510, the driving integrated circuit 550, the bump electrodes 520, the first film layer 630, the second film layer 710, the conductive balls 600, and the metal patterns 580, may be formed.

Figure 16:
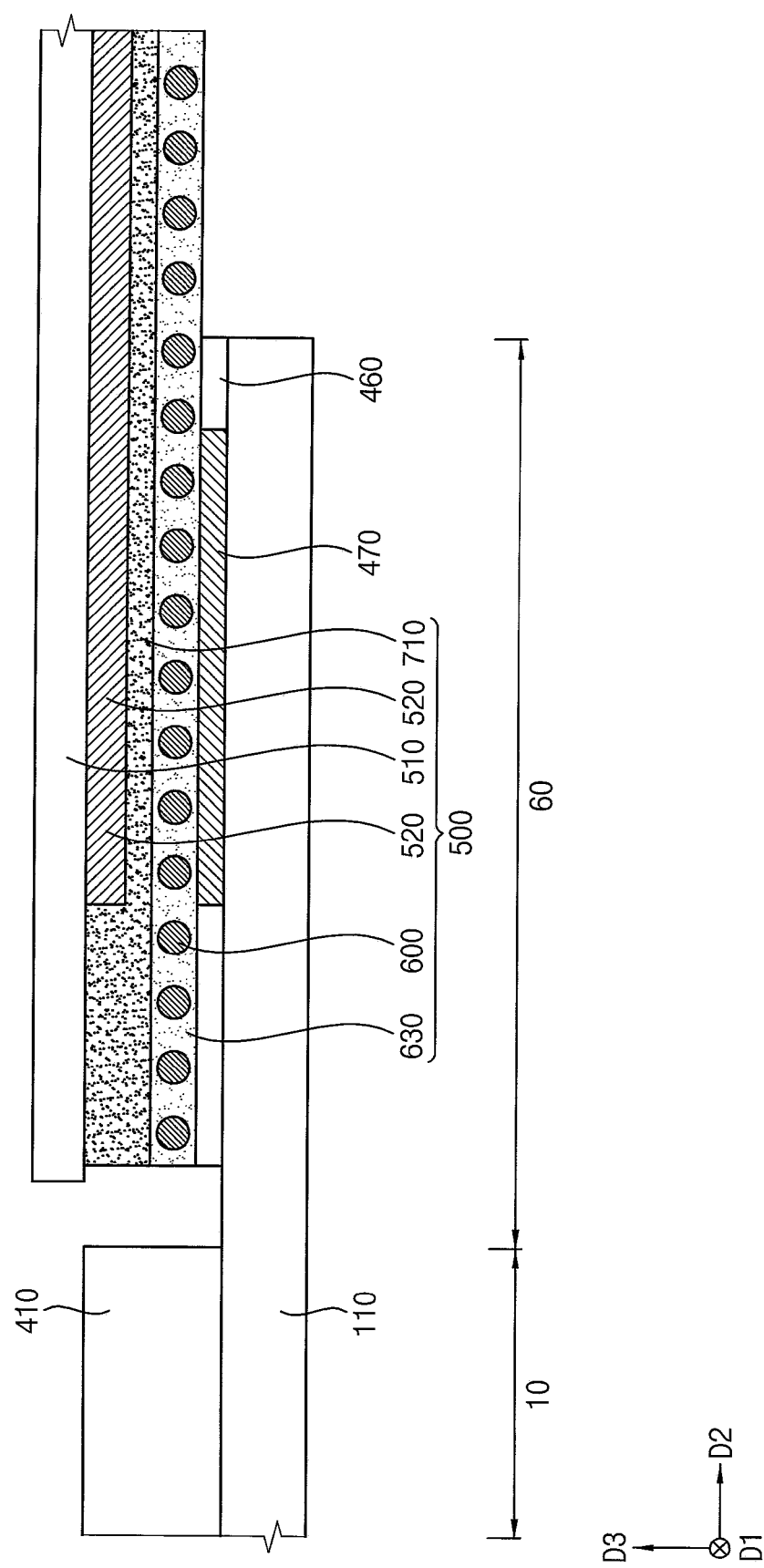

Referring to FIGS. 16 and 17, the conductive film package 500 may be positioned in the pad area 60 of the lower substrate 110. A part of the bottom surface of the first film layer 630 may come into direct contact with the pad electrodes 470 and the insulating layer 460.

Referring to FIGS. 18 and 19, a heating member 750 may come into contact with the top surface of the conductive film package 500. The heating member 750 may be heated to a predetermined temperature, and may apply pressure to the conductive film package 500 in a direction opposite to the third direction D3. In this case, as gaps between the bump electrodes 520 and the pad electrodes 470 become narrow due to the pressure, the second film layer 710 and a part of the first film layer 630 positioned in the first area 61 may reflow into the second area 62, and the first film layer 630 and the second film layer 710 may be cured due to the heat.

As the gaps become narrower, the shapes of the conductive balls 600 positioned in the first area 61 between the bump electrodes 520 and the pad electrodes 470 may be changed from a circular plane shape to an oval plane shape. The conductive balls 600 having the oval plane shape and positioned in the first area 61 are defined as first conductive balls 610, and the conductive balls 600 having the circular plane shape and positioned in the remaining areas except the first area 61 are defined as second conductive balls 620. In addition, at least a part of each of the first conductive balls 610 may be exposed from the first film layer 630 in the first area 61, and the exposed portions of the first conductive balls 610 may come into direct contact with the bump electrodes 520 or the pad electrodes 470.

Accordingly, the first film layer 630 in the first area 61 and the second area 62 may have different thicknesses. For example, the first film layer 630 may have a first thickness in the first area 61, and may have a second thickness greater than the first thickness in the second area 62. In addition, the first film layer 630 may cover the second conductive balls 620 in the second area 62. In addition, the second film layer 710 positioned in the first area 61 may reflow to the remaining areas, except for the first area 61. In some exemplary embodiments, all of the second film layer 710 positioned in the first area 61 may not reflow, and a part of the second film layer 710 may be retained in the first area 61. In addition, when the heating member 750 applies a relatively large pressure in the direction opposite to the third direction D3, diameters of the first conductive balls 610 may be relatively reduced in the third direction D3, or the first conductive balls 610 may penetrate each of the pad electrodes 470 to deform shapes of the pad electrodes 470.

After the curing process is performed, the heating member 750 may be removed from the top surface of the conductive film package 500.

Accordingly, the display device 700 illustrated in FIG. 9 may be manufactured.

The display device according to exemplary embodiments may be applied to various electronic devices including a display device, such as a vehicle-display device, a ship-display device, an aircraft-display device, portable communication devices, display devices for display or for information transfer, a medical-display device, etc.

In the display device according to exemplary embodiments, after the film layer is formed on the bottom surface of the base substrate, the conductive film package 500 is formed on the pad electrodes, so that the pad electrodes may be electrically connected to the external device through the conductive film package even when the second length of the pad area of the display device is reduced to about 0.5 mm.

In addition, the conductive film package may include the base substrate including first and second corner portions having relatively small curvatures and the alignment pattern positioned adjacent to the first and second corner portions, so that the film layer may be easily formed on the second surface of the base substrate.

Further, the conductive film package may include the adhesive pattern, so that the adhesive strength between the base substrate and the film layer may be relatively increased in the second portion of the base substrate, and the amount of reflow of the uncured resin layer may be reduced in the bonding process of bonding the conductive film package to the pad area of the lower substrate. Accordingly, the display device according to the exemplary embodiments may have a relatively reduced pad area.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a lower substrate having a display area and a pad area;
a display structure disposed in the display area of the lower substrate;
pad electrodes disposed in the pad area of the lower substrate and spaced apart from each other in a first direction; and
a conductive film package including:
 a base substrate disposed on the pad electrodes, and including a corner portion having a curved shape;
 bump electrodes disposed in a first portion of a bottom surface of the base substrate and overlapping the pad electrodes;
 metal patterns disposed in second portions of the bottom surface of the base substrate positioned at both sides of the first portion, the metal patterns including:
  an alignment pattern disposed adjacent to the corner portion of the base substrate; and
  an adhesive pattern disposed in parallel with the bump electrodes and spaced apart from the alignment pattern;
a first film layer disposed between the base substrate and the lower substrate and overlapping the pad electrodes, a part of the bump electrodes, and the metal patterns; and
conductive balls disposed inside the first film layer.

* * * * *